(12) United States Patent
Maige et al.

(10) Patent No.: US 6,411,048 B1
(45) Date of Patent: Jun. 25, 2002

(54) METHOD AND DEVICE FOR CONTROLLING A CIRCUIT FOR THE VERTICAL DEFLECTION OF A SPOT SCANNING A SCREEN, IN PARTICULAR FOR A TELEVISION SET OR A COMPUTER MONITOR

(75) Inventors: Philippe Maige, Seyssinet-Pariset; Yannick Guedon, Sassenage, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/490,762

(22) Filed: Jan. 24, 2000

(30) Foreign Application Priority Data

Jan. 22, 1999 (FR) .............................. 99 00715
Nov. 4, 1999 (FR) .............................. 99 13822

(51) Int. Cl.[7] .............................. H01J 29/70
(52) U.S. Cl. ...................... 315/403; 315/397
(58) Field of Search .................. 315/396, 397, 315/403, 407

(56) References Cited

U.S. PATENT DOCUMENTS 4,031,430 A * 6/1977 Enomoto .................... 315/403
4,262,235 A * 4/1981 Neves et al. ................. 315/397

FOREIGN PATENT DOCUMENTS

IT       0297 476 A2 *   4/1989     ............ H03K/4/69

* cited by examiner

*Primary Examiner*—Don Wong
*Assistant Examiner*—Shih-Chao Chen
(74) *Attorney, Agent, or Firm*—Lisa K. Jorgenson; Allen, Dyer, Doppelt, Milbrath & Gilchrist, P.A.

(57) ABSTRACT

The control device includes an output amplifier stage ETS supplied by a main supply for controlling the vertical scan of the spot, and an auxiliary supply capable of delivering an overvoltage and a first two-way switch connected to the output stage and controllable to allow the overvoltage to be delivered to the vertical deflection circuit for flyback of the spot. The output stage is a stage having at least two transistors which are capable of operating in alternating switching mode, at least for control of the vertical scan of the spot, this stage being associated with a smoothing filter connected to the common terminal of the two transistors. The device includes a second two-way switch connected between a first transistor of the output stage and a first terminal of the main supply and controllable to prevent delivery of the overvoltage during control of the vertical scan of the spot.

76 Claims, 9 Drawing Sheets

METHOD AND DEVICE FOR CONTROLLING A CIRCUIT FOR THE VERTICAL DEFLECTION OF A SPOT SCANNING A SCREEN, IN PARTICULAR FOR A TELEVISION SET OR A COMPUTER MONITOR

FIELD OF THE INVENTION

The invention relates to the control of the vertical deflection of a spot scanning a screen, for example, screens of television sets and/or computer monitors.

BACKGROUND OF THE INVENTION

A spot scans a screen in two orthogonal directions, namely a line scan and a vertical scan. The line scan takes place at a much higher frequency than the vertical scan. For example, for a television, the line scan may take place at 15625 Hz, whereas the vertical scan takes place, for example, at 50 Hz. When the spot has undergone a forward line scan, a line retrace then occurs in order to scan the next line. Simultaneously with the line scan, the vertical scan allows the spot to scan the screen from the top down. At the end of the downward vertical scan, a rapid retrace of the spot to the top and to the left of the screen (frame retrace) then occurs, this being commonly called "Flyback" by those skilled in the art.

The vertical deflection of the spot therefore comprises a downward vertical scan phase followed by a spot flyback phase. The vertical deflection is generated by a vertical deflection circuit, which is conventionally an inductive circuit generating a magnetic field for deflecting the spot. The conventional devices for controlling vertical deflection circuits (or more simply "vertical deflectors") are formed by linear class AB amplifiers, i.e. an amplifier with the output stage formed by transistors working in their linear range and consequently producing a continuous output voltage. The amplifier amplifies a reference input signal, generally a sawtooth signal, so as to deliver a signal for controlling the vertical scan of the spot. Moreover, in order to ensure flyback of the spot, these control devices are equipped to generate an overvoltage at the terminals of the deflector.

Currently, such control devices have an actual efficiency of about 50% and generally require relatively large heat sinks.

SUMMARY OF THE INVENTION

An object of the invention is to remedy this drawback by increasing the efficiency of such a control circuit, while at the same time reducing the complexity of the heat sinks, so as to reduce the overall cost of the control device.

Yet another object of the invention is to produce such control devices in the form of integrated circuits.

The invention therefore provides a method for controlling a circuit for the vertical deflection of a spot scanning a screen. In the method, the vertical scan of the spot is controlled by an output amplifier stage supplied by a main supply (for example ±15 volts) and the flyback of the spot is initiated by delivering an overvoltage, produced by an auxiliary supply, to the vertical deflection circuit.

The control device includes an output amplifier stage having at least two transistors which are made to operate in Class-D operation (i.e. it is alternately turned on and off) at least for controlling the vertical scan of the spot. The overvoltage is delivered by controlling a first two-way switch connected to the output stage and to the auxiliary supply so as to allow a current to flow through this first switch. In addition, a second two-way switch connected between a first transistor of the output stage and a first terminal (for example +Vcc) of the main supply is controlled so as to prevent a current from flowing through the first switch during the vertical scan of the spot and thus to prevent the overvoltage being delivered during the vertical scan of the spot.

In Class-D operation, the transistors operate in on/off mode, i.e. when one of them is off the other is on, and vice versa. In Class-D operation, when a transistor is off it does not dissipate power, while when it is on it dissipates very little power. The output voltage of the output stage is a "high" or "low" signal. If the duration of the high state is equal to that of the low state, the average value of the output signal is zero. By modulating the duty cycle of the control signal (control pulses of variable width) of the filters and by filtering the high-frequency component, an average voltage is recovered which varies over time. This variation is very slow compared with the chopping frequency (the frequency of the control signal). It is thus possible to achieve an efficiency that may be as high as 90%, as opposed to approximately 45% to 50% in the case of Class-AB operation.

Furthermore, in combination with this Class-D operation, the invention provides for the delivery of the overvoltage by controlling a first two-way switch so as to allow a current to flow through this first switch. Moreover, it is necessary to provide the second two-way switch which is controlled so as to prevent a current from flowing through the first switch during the vertical scan of the spot, and in particular when, in a second phase of the forward scan, the second transistor of the output stage is off.

All the transistors, whether those of the output stage or else those advantageously forming the various two-way switches, may be bipolar transistors. This being the case, especially for the purpose of having an integrated-circuit construction, it is particularly advantageous for these transistors to be isolated-gate field-effect transistors (MOS transistors), for example of the n-channel type.

Although in theory it is not necessary to connect a diode to each transistor in antiparallel to its terminals, this proves to be preferable, especially if bipolar transistors are used, so as to allow good conduction of the transistors in both directions, but also when MOS transistors are used so as to avoid an increase in the threshold voltage of these transistors, which generally operate with large signals. In practice, the antiparallel-connected diode is produced by connecting the source of the transistor to the substrate (or bulk). More generally, it is pointed out here that, in the context of the present invention, a diode is said to be connected in antiparallel with the terminals of a transistor when the anode of the diode is connected to the source of the transistor while the cathode of the diode is connected to the drain of the transistor (when this a MOS transistor).

According to one embodiment of the invention, the first two-way switch comprises a transistor and a diode connected in antiparallel with the terminals of the transistor, the anode of the diode being connected to the first transistor of the output stage. The second two-way switch, which makes it possible to avoid delivery of the overvoltage during control of the vertical scan of the spot, comprises a transistor connected in series between the first transistor of the output stage and the first terminal of the main supply (for example +Vcc). This second two-way switch also comprises a diode connected in antiparallel with the terminals of the transistor, the cathode of this diode being connected to the output stage and the anode being connected to the said first terminal of the main supply.

The vertical scan of the spot comprises a first phase during which the current flows into the vertical deflection circuit and a second phase during which the current flows from the vertical deflection circuit. Moreover, the flyback of the spot comprises a first phase during which the current flows from the vertical deflection circuit and a second phase during which the current flows into the vertical deflection circuit. The transistor of the first two-way switch (i.e. the one which allows the overvoltage to be delivered) is turned off during the vertical scan, while the second two-way switch (i.e. the one which prevents the overvoltage being delivered during the vertical scan) is controlled so as to turn the transistor of this second two-way switch on at least when the second transistor of the output stage is off during the second phase of the vertical scan. Furthermore, the transistor of the second two-way switch is off during the flyback of the spot, while the transistor of the first two-way switch is turned on at least during the second phase of the flyback of the spot.

In practice, for reasons of simplicity of control and of power dissipation, it is preferable to turn the transistor of the second two-way switch on right from the start of the vertical scan of the spot and, during the flyback of the spot, to turn the transistor of the first two-way switch on as soon as the transistor of the second two-way switch has been turned off.

Variations are possible for generating the overvoltage necessary for flyback of the spot. An external auxiliary supply or else a so-called internal auxiliary supply, generally including a capacitor, called an auxiliary or flyback capacitor, may be provided. In a first variant (external auxiliary supply), the first two-way switch is connected in series between the auxiliary supply and the first transistor of the output stage. In a second variant (internal auxiliary supply), the auxiliary supply comprises an auxiliary capacitor, a first terminal of which is connected, on the one hand, to the first terminal of the main supply (for example +Vcc) via the first two-way switch and, on the other hand, to a second terminal of the main supply (−Vcc for example, or else earth) via a controllable auxiliary switch. The second terminal of the capacitor (for example, the positive terminal) is connected to the first transistor of the output stage and to the second two-way switch. The auxiliary switch is then open when the transistor of the first two-way switch is on, and vice versa.

More specifically, according to one embodiment, the auxiliary switch is closed during the vertical scan of the spot and this auxiliary switch is open during the flyback of the spot. In the variant using the internal auxiliary supply, the transistor of the first two-way switch is connected between the first terminal of the auxiliary capacitor and the first terminal (for example +Vcc) of the main supply. It is therefore particularly advantageous to use the energy stored in the auxiliary capacitor to turn on the transistor of this first two-way switch.

Thus, according to one embodiment of the invention, the gate of the transistor of this first two-way switch is connected to the first terminal of the auxiliary capacitor in order to turn this transistor on and the gate of the transistor of the first two-way switch is connected to its source in order to turn this transistor off.

In general, a bootstrap capacitor is advantageously connected between the source and the gate of the first transistor of the output stage so as to make it easier to turn it on. In one embodiment of the invention, the energy stored in this bootstrap capacitor is advantageously used to turn on the transistor of the second two-way switch during the vertical scan of the spot. Furthermore, this embodiment, using the bootstrap capacitor, is compatible with both of the variants relating to the auxiliary supply (external auxiliary supply or internal auxiliary supply via the auxiliary capacitor).

More specifically, the bootstrap capacitor is advantageously connected to the gate of the transistor of the second two-way switch during the vertical scan of the spot and the gate of the transistor of this second two-way switch is connected to its source during the flyback of the spot.

According to one embodiment of the invention, allowing the transistor to be controlled more simply, the transistors of the Class-D output stage are controlled on the basis of a reference signal during the vertical scan phase of the spot and the first transistor of the output stage is turned on during the flyback phase of the spot. Moreover, as a variation, it is possible to amplify the reference signal feedback-modified by the current passing through the deflection circuit so as to deliver an error signal. The point when the error signal crosses a predetermined threshold is then detected and the flyback phase of the spot is triggered when the error signal crosses the said threshold.

The invention is also directed to a device for controlling a circuit for the vertical deflection of a spot scanning a screen, this device comprising an output amplifier stage supplied by a main supply for controlling the vertical scan of the spot, and an auxiliary supply capable of delivering an overvoltage to the vertical deflection circuit for flyback of the spot. According to a general characteristic of the invention, the output stage is a stage comprising at least two transistors capable of operating in Class-D operation, at least for controlling the vertical scan of the spot, this stage being associated with a smoothing filter connected to the common terminal of the two transistors. Moreover, the device includes a first controllable two-way switch connected to the output stage and to the auxiliary supply, as well as a second controllable two-way switch connected between a first transistor of the output stage and a first terminal (+Vcc for example) of the main supply.

The device also includes a controller for controlling: the transistors of the output stage in Class-D operation; the first switch so as to allow a current to flow through this first switch and to allow the overvoltage to be delivered; and the second switch so as to prevent a current from flowing through the first switch during the vertical scan of the spot and thus prevent the overvoltage from being delivered during the vertical scan of the spot.

According to one embodiment of the invention, during control of the vertical scan of the spot, the controller controls the transistors of the Class-D output stage on the basis of a reference signal present as an input to the device, opens the first two-way switch and closes the second two-way switch. During control of the flyback of the spot, the controller turns the first transistor of the output stage on, opens the second two-way switch and closes the first switch.

According to one embodiment of the invention, the device includes a preamplification stage which receives the reference input signal feedback-modified by the current passing through the vertical deflection circuit. This preamplification stage delivers an error signal. The device further includes a detector for detecting when the error signal crosses a predetermined threshold. The controller then triggers the flyback phase of the spot when the error signal crosses the threshold.

It is also possible, as a variant, for the output stage to be formed by four transistors in a complete bridge arrangement.

In other words, the output stage then comprises two other transistors capable of operating in the switching mode in an alternating fashion at least for controlling the vertical scan of the spot. The smoothing filter is then connected between the common terminal of the first two transistors and the common terminal of the other two transistors of the output stage. The smoothing filter is further distributed on either side of the vertical deflection circuit. Of course, in this case, the overvoltage generator necessary for flyback of the spot, as well as the overvoltage inhibitor for inhibiting the delivery during the vertical scan of the spot, are connected only to a single pair of transistors of the bridge.

The invention is also directed to a television set or a computer monitor comprising a screen, a circuit for the vertical deflection of a spot scanning the screen and a device for controlling the vertical deflection circuit, as described above.

BRIEF DESCRIPTION OF THE DRAWINGS

Further advantages and characteristics of the invention will appear in the description of non-limiting embodiments and in the appended drawings, in which.

DETAILED DESCRIPTION OF THE PREFERRED EMBODIMENTS

Figure 1:
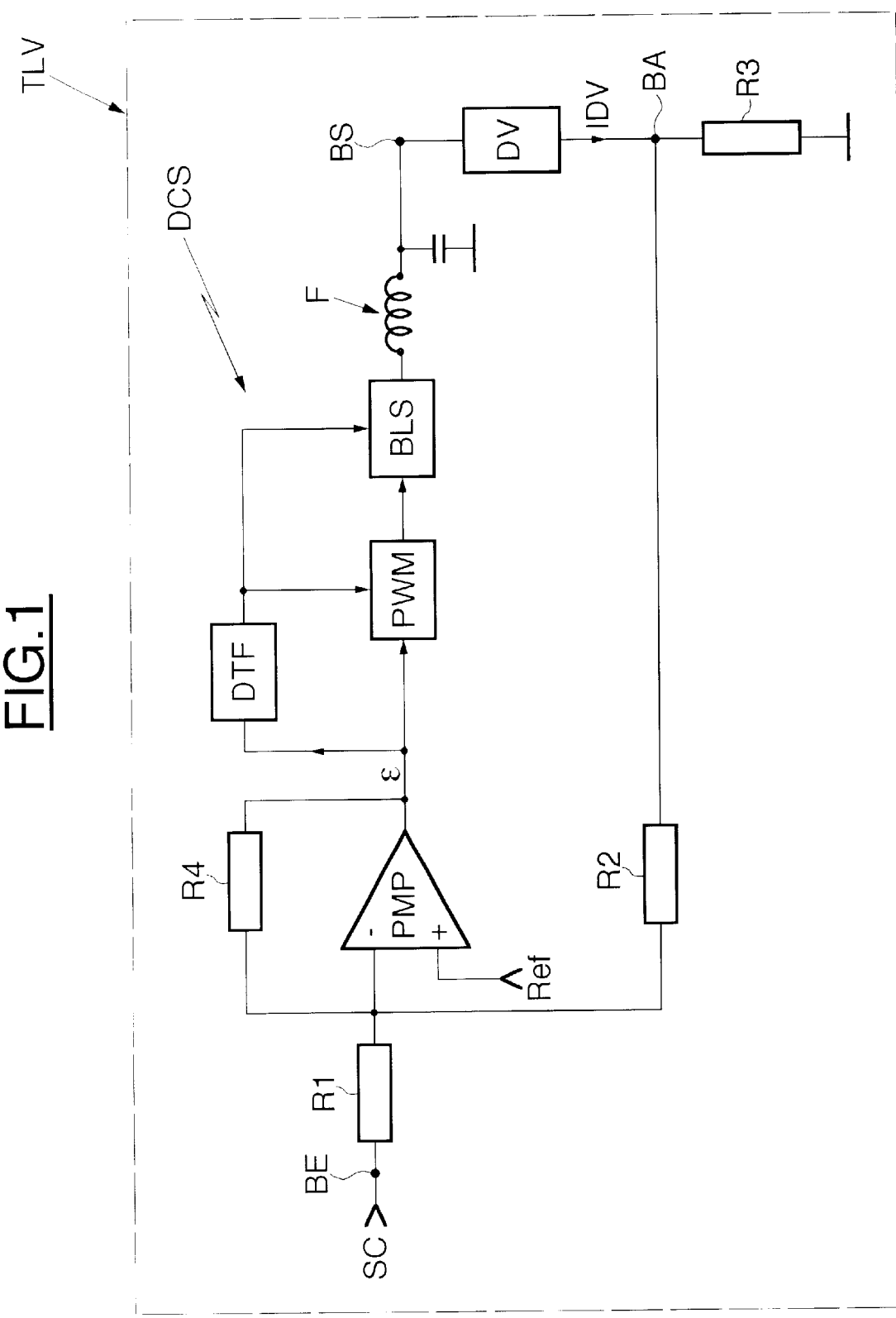
FIG. 1 illustrates the architecture of a control device according to the invention.

In FIG. 1, the reference DCS generally denotes a device for controlling the circuit DV for the vertical deflection of a spot scanning a screen, for example a television screen or a computer monitor screen. This DCS circuit may therefore be incorporated into a television set and/or computer monitor TLV. The vertical deflection circuit has a structure, which is inductive. A current IDV passing through the vertical deflection circuit creates a magnetic field used for deflecting the spot.

The control circuit DCS comprises an input terminal BE which receives a reference input signal SC, the waveform of which will be explained in greater detail below, and an output terminal BS which delivers a current IDV into the vertical deflector DV. The control device DCS comprises, on the input side, a preamplification stage PMP connected in the present case as an inverter, and the inverting input of which is connected to the input terminal BE via a first resistor R1. The inverting input of the preamplifier PMP is also connected via a second resistor R2 to another terminal BA of the deflector DV. This inverting input is also connected to the output of the preamplifier PMP via a resistor R4. The resistors R1 and R4 fix the gain of the preamplifier PMP with respect to the reference input signal and the resistors R2 and R4 fix the gain for the feedback loop.

A resistor R3, typically about 1 ohm connects the deflector DV to earth or ground. The noninverting input of preamplifier PMP is connected to a reference voltage Ref. The output of the preamplifier PMP delivers an error signal $\epsilon$ which will be taken into account, especially by detection means DTF, the structure and function of which will be explained in greater detail below. The device DCS also comprises an output circuit BLS comprising, as will be seen in greater detail below, an output stage having two or four transistors operating in Class-D operation.

In FIG. 1, a circuit PWM, illustrated diagrammatically upstream of the circuit BLS, receives the signal $\epsilon$ and comprises a controller to control the various transistors of the output circuit BLS. This controller comprises in particular, as will be seen in greater detail below, means for generating pulses of variable widths which are intended to be applied to the gates of the transistors of the output amplifier stage.

Figure 2:
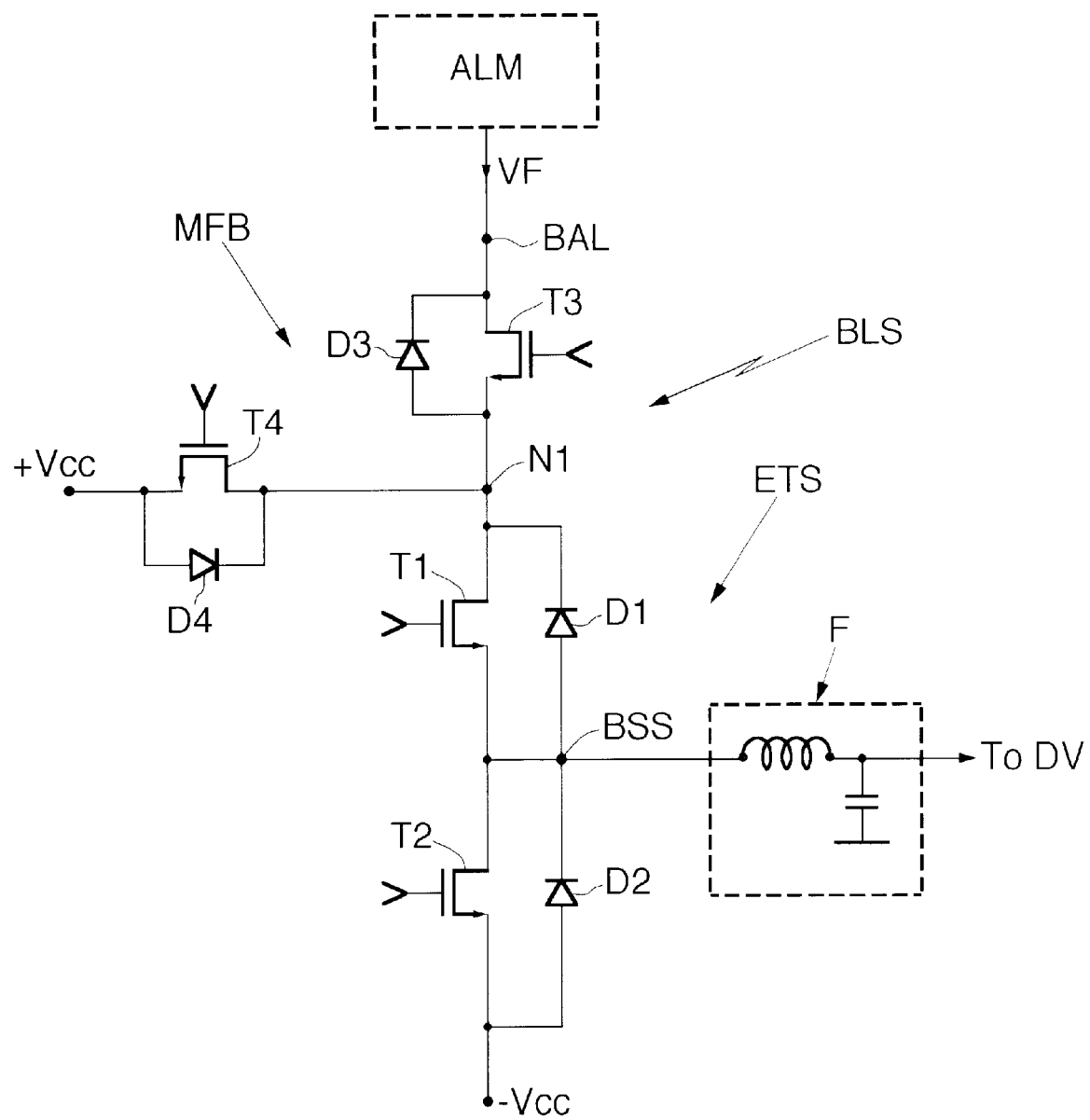
FIG. 2 illustrates, in greater detail, one embodiment of the output stage and of means for generating the overvoltage necessary for flyback of the spot.

Referring now more particularly to FIG. 2, the output circuit BLS comprises an output amplifier stage ETS formed here by two transistors T1 and T2 as a half-bridge. These two transistors T1 and T2 here are two NMOS transistors, each associated with a diode D1 (or alternatively D2) connected in antiparallel with their terminals. More specifically, the cathode of the diode D1 is connected to the drain of the transistor T1, while the anode of the diode D2 is connected to the source of the transistor T2, which source is itself connected to the negative terminal −Vcc of the main supply. The anode of the diode D1 and the cathode of the diode D2 are connected together at the common terminal of the transistors T1 and T2 and form the output terminal BSS of this stage ETS. This output terminal BSS is connected to the terminal BS of the control device DCS, and consequently to the deflection circuit DV via an inductive-capacitive smoothing filter F.

The gates of the transisitors T1 and T2 are controlled by the controller incorporated in this PWM circuit. The diodes D1 and D2 here are produced by linking the source of each transistor T1, T2 to the substrate. Moreover, the circuit BLS comprises means MFB associated with this output stage ETS and intended especially for controlling the generation of the overvoltage necessary for flyback of the spot.

More specifically, in the variant described in this FIG. 2, and corresponding to an auxiliary supply ALM external to the circuit BLS (for example, an auxiliary voltage source of several tens of volts), the means MFB comprise a first two-way switch formed here by an NMOS transistor T3, the source of which is connected to the drain of the first transistor T1 of the stage ETS and the drain of which is connected to a terminal BAL intended to receive the voltage VF delivered by the auxiliary supply ALM. This first two-way switch also comprises a diode D3, the anode of which is connected to the source of the transistor T3 and the cathode of which is connected to the drain of the transistor T3.

Apart from this first two-way switch, the means MFB comprise a second two-way switch formed of an NMOS transistor T4 and from a diode D4 connected in antiparallel with the terminals of the transistor T4. More specifically, the drain of the transistor T4 and the cathode of the diode D4 are connected to the drain of the first transistor T1, while the source of the transistor T4 and the anode of the diode D4 are connected together to the +Vcc terminal of the main supply.

Figure 3:
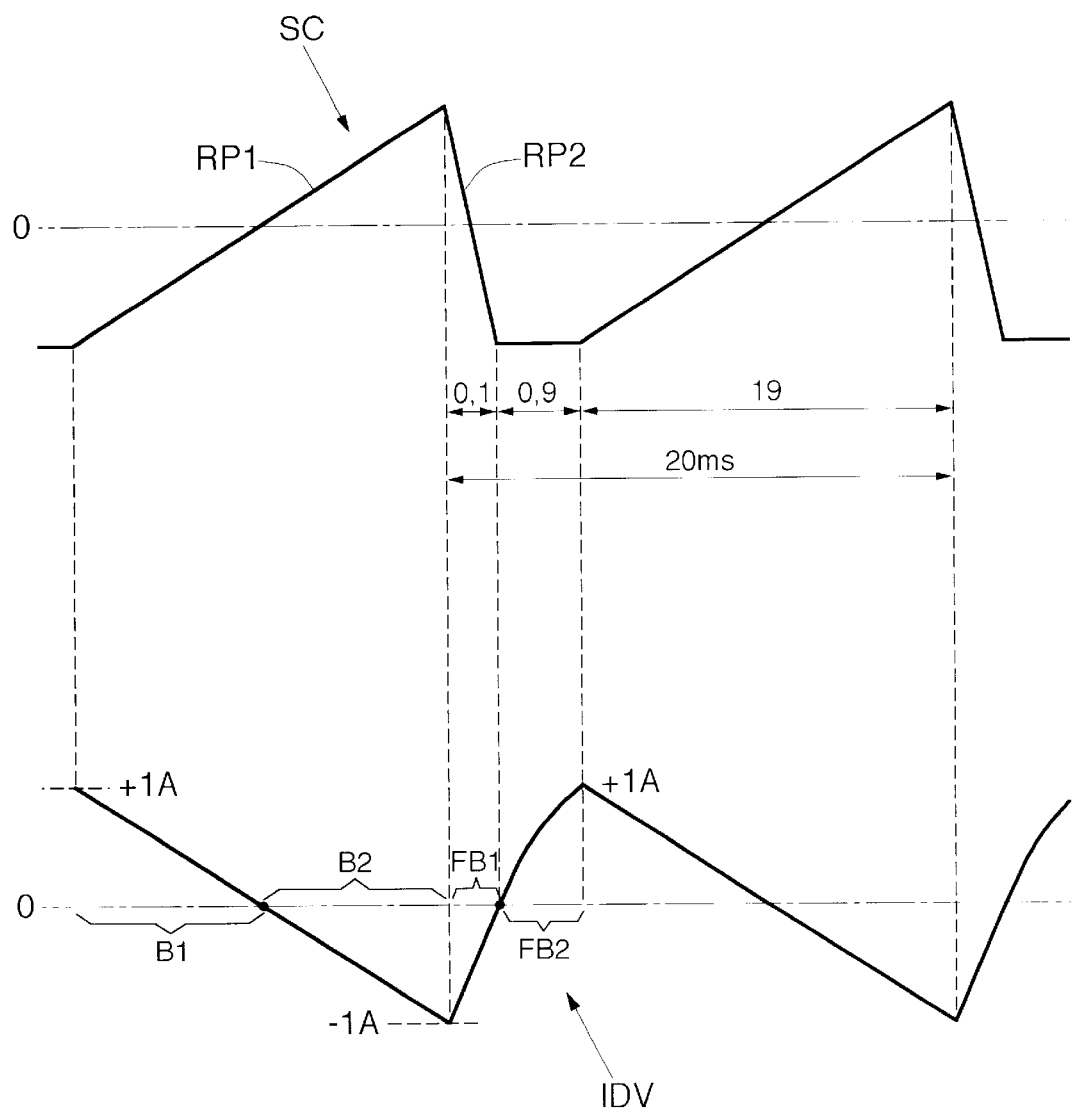
FIG. 3 illustrates a reference input signal and one method of operating the device according to the invention.

The operation of the device according to the invention will now be described in greater detail, more particularly with reference to FIGS. 1, 2 and 3. The top part of FIG. 3 shows a conventional waveform of a reference input signal SC. Such a signal SC, which illustrates either the current or the voltage at the input terminal BE, includes a succession of ramps RP1 centred, in the example described, around the 0 level and each having typically a duration of 19 ms. Each ramp RP1 is followed by a decreasing portion RP2 having a duration of about 0.1 ms, this being followed by a flat portion whose duration is about 0.9 ms. Of course, these numerical values are given here by way of example.

The bottom part of FIG. 3 illustrates the behavior of the current IDV flowing through the vertical deflector DV. A linear decrease in the current IDV, corresponding to the vertical scan phase of the spot on the screen, corresponds to the ramp RP1 of the reference input signal SC. This decrease takes place between two opposed values, for example ±1 amp. In a first phase B1 of the scan, the current IDV is positive, i.e. it flows from the output stage ETS and therefore into the deflector DV. In the second phase B2 of the vertical scan, the current IDV is negative, i.e. it flows from the deflector DV and consequently into the stage ETS.

The flyback phase of the spot corresponds to the increase in the current IDV from the −1 amp value to the +1 amp value. It should therefore be noted here that this flyback of the spot is initiated by the decreasing portion RP2 of the reference input signal SC, but takes place over a slightly longer duration, typically about 0.8 to 0.9 ms. This is the reason why the reference input signal SC comprises a flat part allowing the next ramp to be triggered only when the spot has actually returned to its starting position (at the top and to the left of the screen).

During this flyback phase, the means MFB create an overvoltage, typically of about a few tens of volts, at the terminals of the deflector DV. Here again, the flyback of the spot comprises two phases, namely a first phase FB1 during which the current IDV flows into the stage ETS and a second phase FB2 during which the current IDV flows from the stage ETS.

During the vertical scan of the spot (phases B1 and B2), the transistors T1 and T2 are turned alternately on and off at a chopping frequency very much higher than the vertical scan frequency (in this case, for example, greater than or equal to 100 kHz). The average value of the voltage at the common point BSS of the transistors is then recovered at the output terminal BS of the output stage, this voltage being smoothed in the smoothing filter F so as to obtain the decreasing behaviour, illustrated in FIG. 3 (phases B1 and B2) of the current IDV.

Of course, the width of the control pulses intended for turning each of the transistors on or off depends on the value of the reference input signal, and consequently on the current instant of the vertical scan phase. Thus, in the first phase B1 of the scan, the transistor T1 will be on longer than the transistor T2, and vice versa in the second phase B2 of the scan. In other words, the duration of a control pulse intended for turning the transistor T1 on decreases from approximately 90% of the chopping period to approximately 10% of the chopping period. Simultaneously, the duration of the control pulse intended to turn the transistor T2 on increases from approximately 10% of the chopping period to approximately 90% of the chopping period. When the current IDV passes through the zero value, each of the control pulses occupies 50% of the chopping period.

During the two scan phases B1 and B2, the transistor T3 is set to the off state (first two-way switch open) and the transistor T4 is turned on (second two-way switch closed). Consequently, during the first phase B1 of the scan, when the transistor T1 is on, the current flows through the transistor T4, the diode D4 and the transistor T1. When the transistor T1 is off, the current flows through the transistor T2 and the diode D2. In the second phase B2 of the scan, when the transistor T2 is on, the current flows through the transistor T2. However, when the transistor T2 is off, the current flows through the transistor T1, through the diode D1 and then through the transistor T4.

It should be noted here that the presence of the two-way switch T4, D4 is for preventing the current flowing back through the diode D1 and the transistor T1 from prematurely triggering the generation of the overvoltage VF when the transistor T2 is off during the second phase B2 of the scan. This is because, when the transistor T4 is not conducting, the backflow current can then pass through the diode D3 and cause an overvoltage onset to be generated at the terminals of the deflector, thus initiating a rapid rise of the spot until the transistor T2 is on again.

On the other hand, because of the transistor T4 being on and because of the fact that the overvoltage VF is chosen to be greater than the main supply voltage +Vcc, the current does not flow through the diode D3 and does not cause premature generation of the overvoltage. It should also be noted here that it would be necessary, in theory, to close the second two-way switch (i.e. to turn the transistor T4 on) only during the second phase B2 of the scan and during the periods in which the transistor T2 is off. This being so, it would be necessary to control the transistor T4 at the high chopping frequency. It is therefore much simpler to leave the transistor T4 on throughout the duration of the vertical scan of the spot (phases B1 and B2).

At the end of the vertical scan of the spot, the switching of the transistors T1 and T2 is interrupted at the chopping frequency (i.e. Class-D operation) and the transistor T1 is turned on. Furthermore, the second two-way switch is opened, i.e. the transistor T4 is turned off and the first two-way switch is closed, i.e. the transistor T3 is turned on. This therefore results in the generation of an overvoltage at the terminals of the deflector DV and consequently flyback of the spot. During the first part FB1 of the flyback, the current flows through the diode D1 and the transistor T1 then through the diode D3 and the transistor T3. During the second part FB2 of the flyback, the current flows through the transistor T3 and then through the transistor T1.

It should be noted here that it is possible, during this flyback phase, to continue the alternating switching of the transistors T1 and T2 of the output stage at the chopping frequency. This being so, the fact of interrupting this switching and of turning the transistor T1 on over the entire duration of the flyback allows the overvoltage VF to be permanently applied to the terminals of the deflector (i.e. without a voltage drop during the periods in which the transistor T1 would be off). Those skilled in the art will have noted that, in order to turn the transistor T4 on during the scan phase, it is necessary to generate a gate voltage above the +Vcc value since the source of the transistor T4 is at this voltage +Vcc. Likewise, in order to turn the transistor T3 on during the flyback, again it is necessary to generate a gate voltage above the +Vcc value since the source of the transistor T3 is at the +Vcc value. One conventional approach may include generating these voltages greater than the +Vcc value using charge pumps, the structure of which is known per se.

The controller, which is used for controlling the various transistors of the control device according to the invention in the manner which has just been described, can also be easily produced by those skilled in the art using conventional logic circuits. This is especially the case for generating the variable-width control pulses as well as for controlling the transistor T5 (as indicated below) and for controlling the transistors T3 and T4 via the charge pumps.

Moreover, it is advantageous to detect the end of the vertical scan of the spot so as to be able to control the transistors T3 and T4 in order to trigger the flyback phase. This is the function of the detection means DTF. These are formed of a comparator which compares the error signal c with a predetermined threshold, for example +0.5 volts.

When at the end of the vertical scan of the spot the error signal increases until it exceeds the threshold, because of the inertia of the deflector, the detection means then deliver a detection signal to the controller, in response to which detection signal the controller controls the various transistors of the control device as indicated above.

Figure 4:
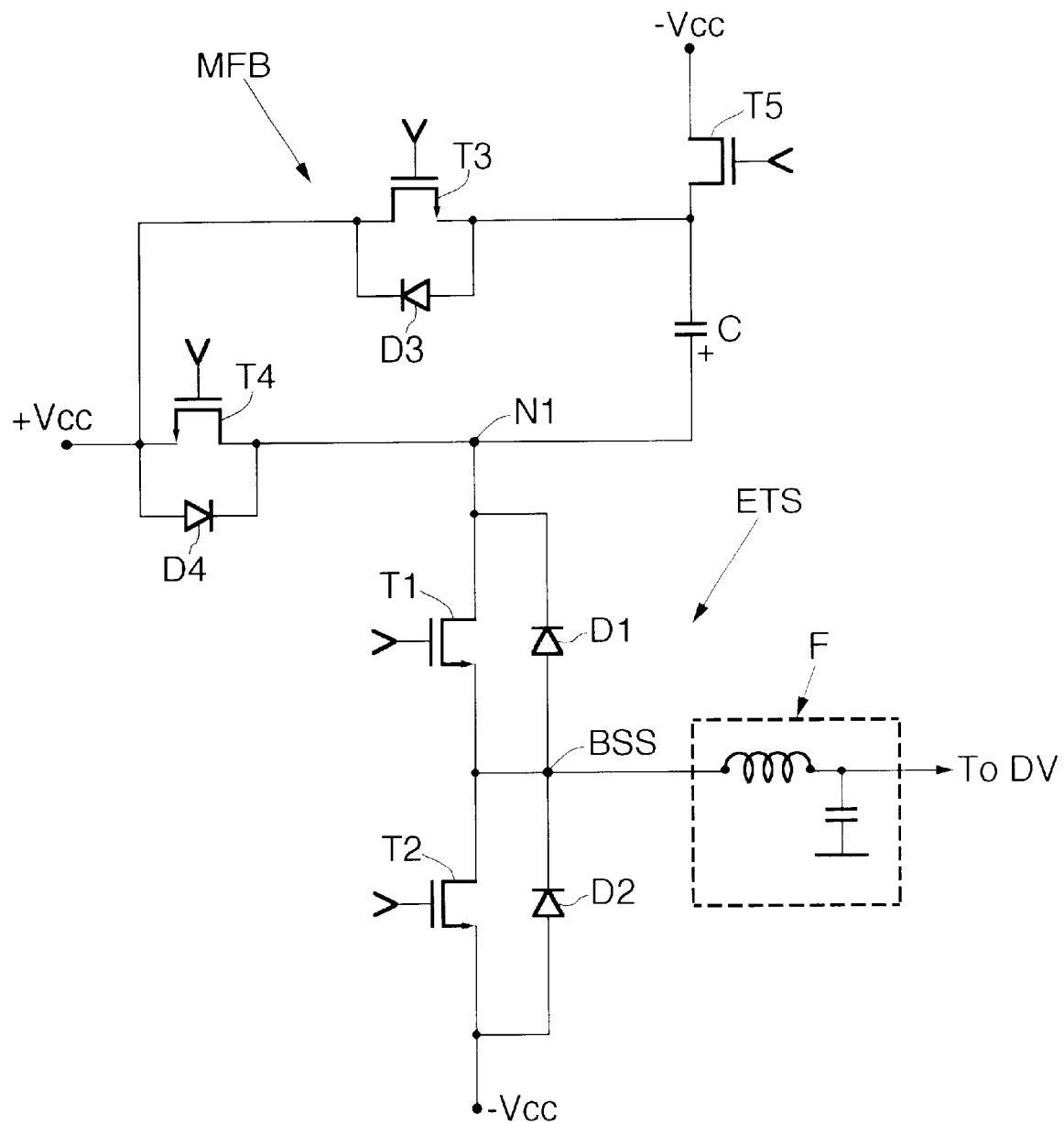
FIG. 4 illustrates another embodiment of an output stage and of the means for generating the overvoltage necessary for flyback of the spot.

The variant illustrated in FIG. 4 corresponds to the use of an internal auxiliary supply having an auxiliary capacitor C (flyback capacitor). More specifically, in the example illustrated, the positive terminal of the capacitor C is connected to the drain of the transistor T1 and to the drain of the transistor T4, while the other terminal of the capacitor C is connected to the source of the transistor T3, as well as to the −Vcc terminal of the main supply via an auxiliary switch T5, which may also be formed of an NMOS transistor controlled on its gate by the control means. Moreover, in this variant, the drain of the transistor T3 and the cathode of the diode D3 are connected together to the +Vcc terminal of the main supply.

During the vertical scan of the spot, the transistors T1 and T2 are controlled as explained above and the transistors T4 and T5 are turned on. The transistor T3 is off. During the first phase B1 of the scan, the current then flows through the transistor T4, through the diode D4 and then through the transistor T1 when the latter is on. When the transistor T1 is off, the current flows through the transistor T2 and through the diode D2. In the second phase B2 of the vertical scan, the current flows through the transistor T2, when the latter is on, and when it is off, the current flows through the transistor T1 and the diode D1 and then through the transistor T4. After the second phase B2 of the scan, the auxiliary capacitor C is charged.

The end of the scan is detected as explained above. During the flyback phase of the spot, the transistors T4 and T5 are kept off by the controller and the transistor T3 is on, as is the transistor T1. During the first flyback phase FB1, the current flows through the diode D1 and transistor T1, then through the capacitor C and then through the transistor T3 and the diode D3. In the second flyback phase FB2, the current from the +Vcc terminal flows through the transistor T3 and then the capacitor C and the transistor T1. The voltage across the terminals of the capacitor C during the flyback of the spot has allowed the overvoltage to be generated. The function of the transistor T4 is identical to that described above for the variant using the external auxiliary supply.

As described above, one way of generating voltages greater than the +Vcc supply voltage includes using charge pumps. However, these require an oscillator, a pumping capacitor, a storage capacitor, i.e. the gate of the transistor to be controlled, and an inverter capable of delivering, as output, voltage excursions ranging from −Vcc to +Vcc. Apart from the fact that they require additional components, they generally deliver a small current.

Figure 5:
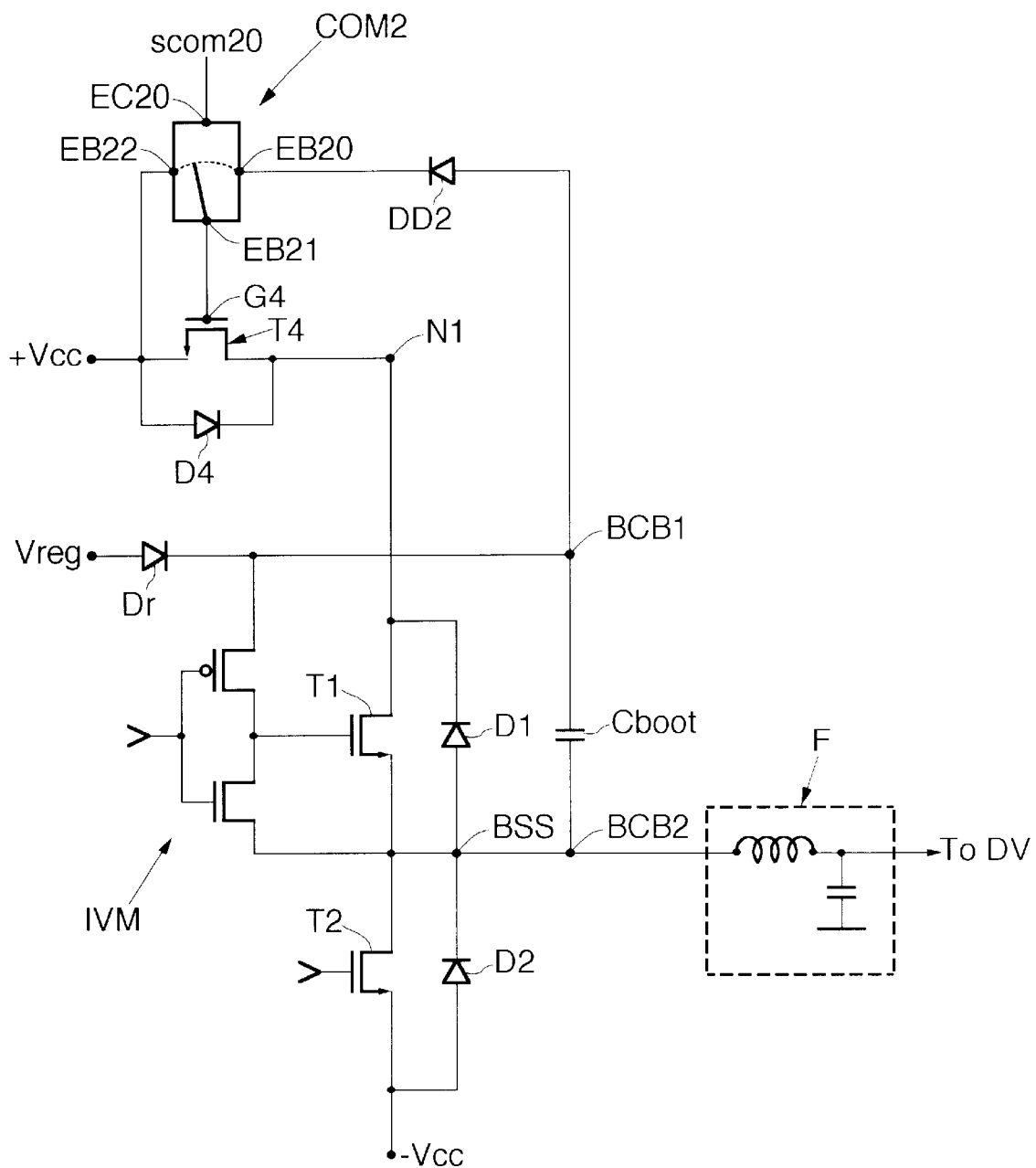
FIG. 5 illustrates, diagrammatically, one embodiment of the invention, using the energy stored in a bootstrap capacitor to actuate the second two-way switch of the device according to the invention.
Figure 6:
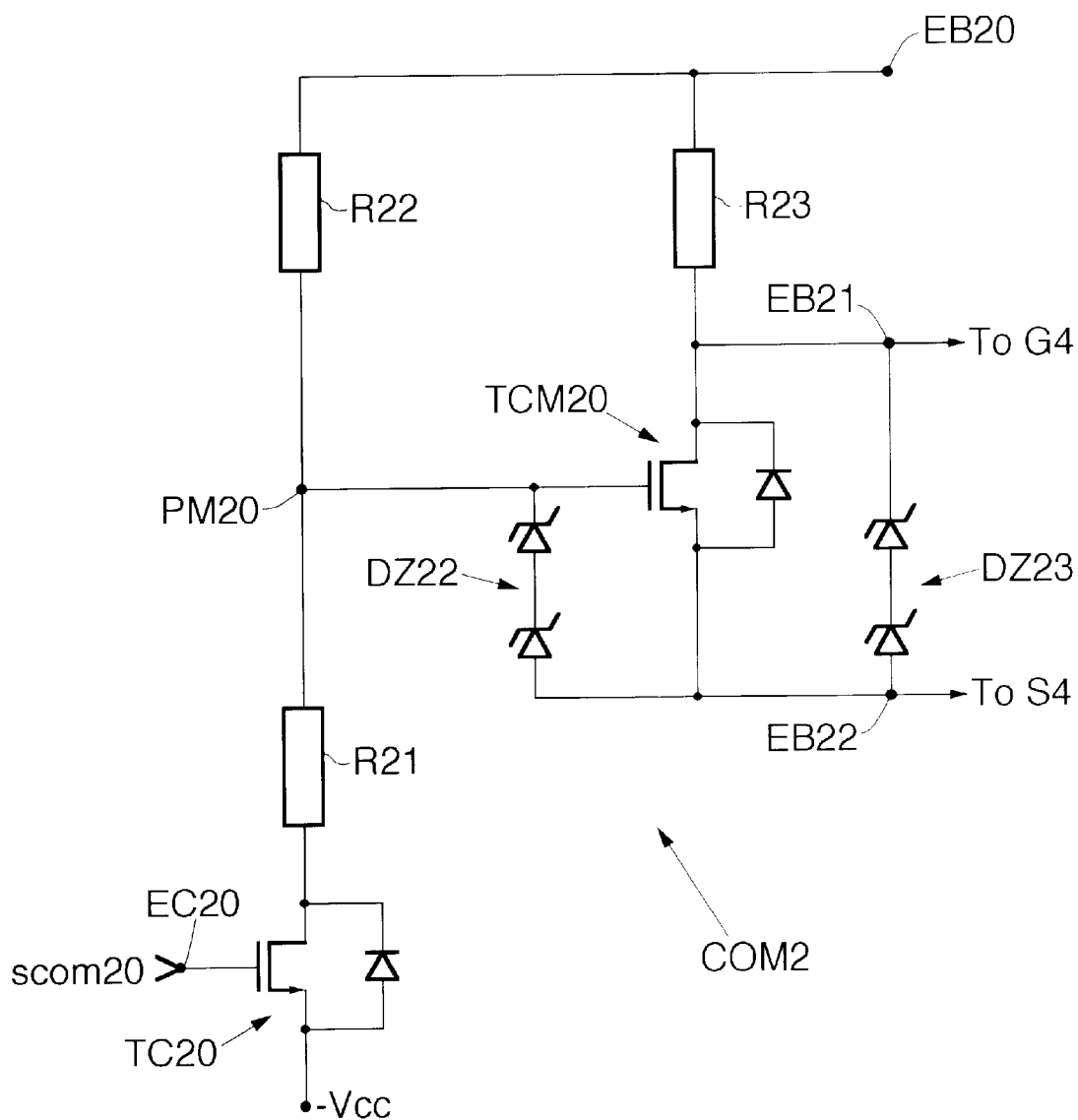
FIG. 6 illustrates in greater detail, and again diagrammatically, part of the embodiment illustrated in FIG. 5.
Figure 7:
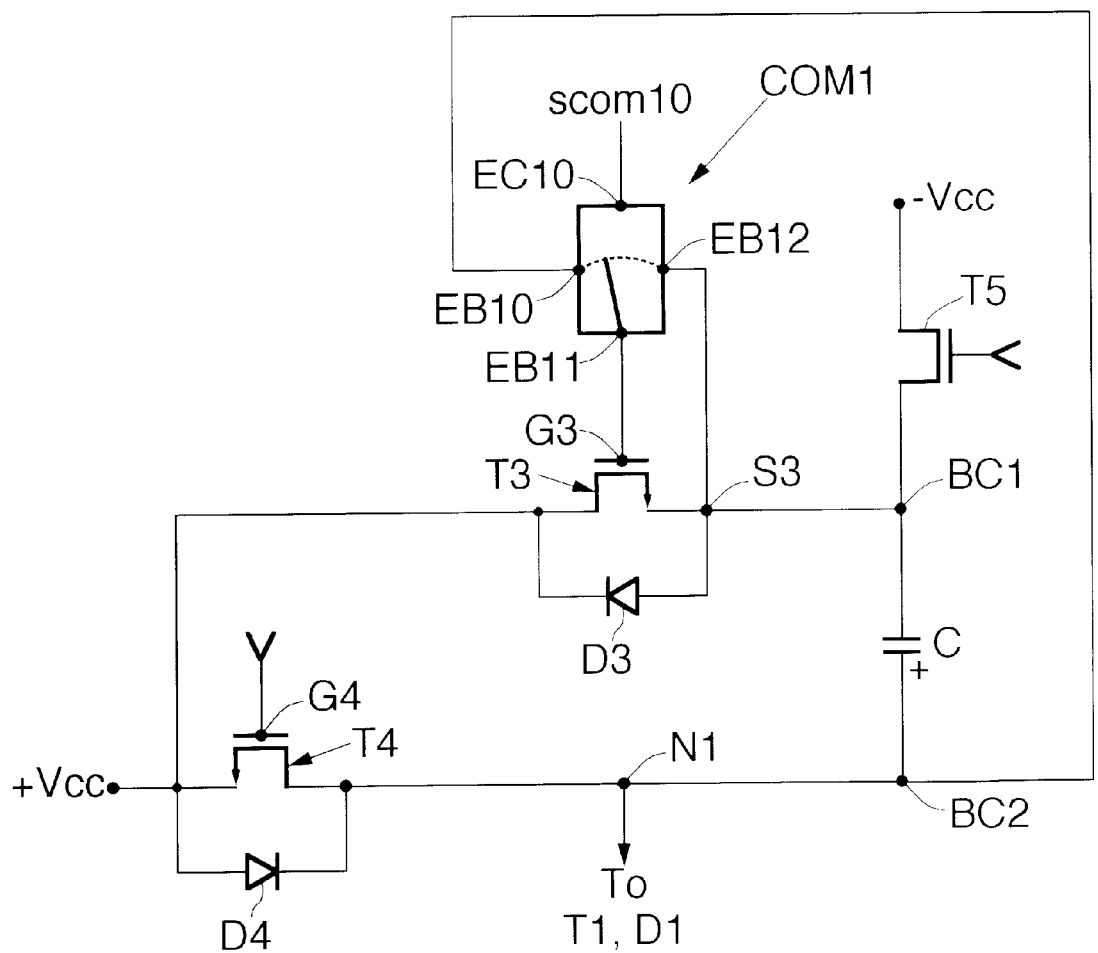
FIG. 7 illustrates an embodiment of the invention using the auxiliary capacitor (flyback capacitor) for controlling the first two-way switch of the device according to the invention.
Figure 8:
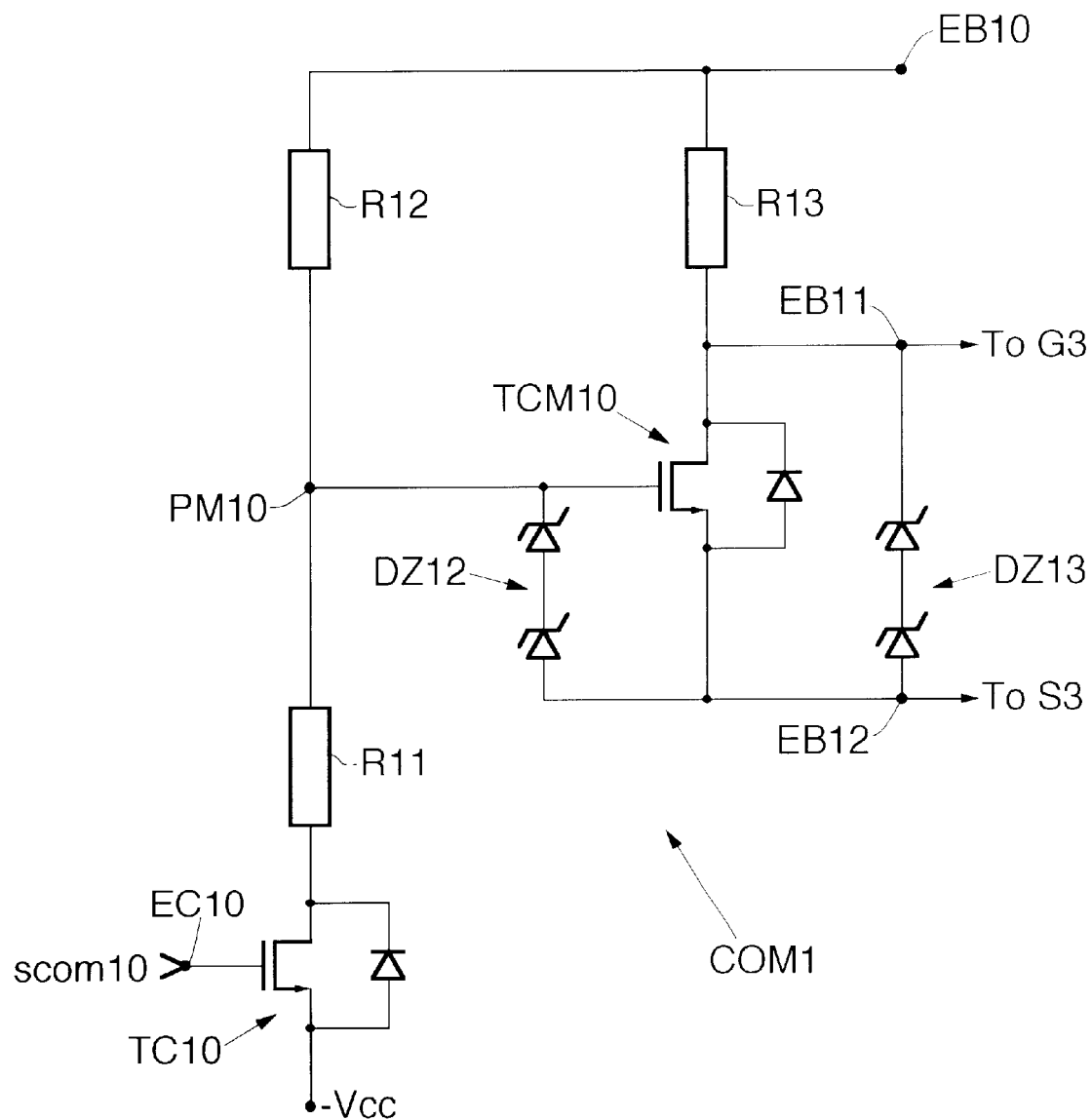
FIG. 8 illustrates in greater detail part of the embodiment illustrated in FIG. 7.

The embodiments illustrated more particularly in FIGS. 5 to 8 make it possible to dispense with the use of such conventional charge pumps. FIGS. 5 and 6 illustrate an advantageous embodiment allowing the transistor P4 to be controlled, while FIGS. 7 and 8 illustrate an advantageous embodiment allowing the transistor T3 to be controlled.

The embodiment in FIG. 5 is compatible with that illustrated in FIGS. 2 and 4. In order to simplify matters, FIG. 5 shows only part of the device according to the invention and, in this regard, FIGS. 2, 4 and 5 show the node N1 to which the parts not illustrated in FIG. 5 and illustrated in FIGS. 2 and 4 are connected. As indicated diagrammatically in FIG. 5, it is conventional in some applications, when the +Vcc supply voltage is relatively high, to use a bootstrap capacitor Cboot to obtain, on the gate of the transistor T1, a voltage sufficiently greater than the source voltage of the transistor T1 so as to allow this transistor T1 to conduct.

More specifically, this boostrap capacitor Cboot, connected to the transistor T1, comprises a first terminal BCB1 connected to the gate of the transistor T1 via an inverter IVM formed by two complementary transistors (CMOS inverter). The input of the inverter is controlled by a logic signal coming from the means generating the variable-width control pulses and the output of the inverter is connected to the gate of the transistor T1. Moreover, the first terminal BCB1 of the bootstrap capacitor is connected to a regulating voltage vreg via a diode Dr. This regulating voltage is, for example, 12 volts.

The second terminal BCB2 of the bootstrap capacitor is connected to the source of the transistor T1 and to the smoothing filter F. When the transistor T2 is on, the transistor T1 is off and the bootstrap capacitor Cboot charges up to the regulating voltage Vreg. The voltage at the source of the transistor T1 is then −Vcc. When the transistor T2 has to be off and the transistor T1 has to be turned on, this voltage of −Vcc on the source of the transistor T1 allows the latter to be turned on by the control pulse delivered to the inverter IVM. When the transistor T1 comes on, the voltage of its source then rises to +Vcc and the gate voltage rises to the voltage Vcc+Vboot, where Vboot is the voltage at the terminal BCB1 of the bootstrap capacitor. This therefore results in a gate-source voltage difference of about 10 volts, thereby allowing the transistor T1 to continue to conduct.

Advantageously, the invention uses the energy stored in the bootstrap capacitor Cboot to turn on the transistor T4 of the second two-way switch. For . this purpose, the controller comprises a controllable switch COM2, which is denoted hereafter by "second switch" by analogy with the term "second two-way switch" with which it is associated. This second switch COM2 comprises a terminal EB20 connected to the first terminal BCB1 of the bootstrap capacitor via a diode DD2, the anode of which is connected to this first terminal BCB1 of the bootstrap capacitor.

The switch COM2 also comprises a terminal EB21, connected to the gate G4 of the transistor T4 of the second two-way switch, and a terminal EB22, connected to the source S4 of this transistor T4. The switch COM2 also has a control input EC20 which receives a logic control signal scom20. This logic control signal scom20 allows the controller to set the switch COM2 to a first state in which the switch COM2 connects the gate G4 and the source S4 of the transistor T4 together, and a second state in which the switch COM2 connects the gate G4 of the transistor T4 to the cathode of the diode DD2, and consequently to the first terminal BCB1 of the bootstrap capacitor.

As will be seen in greater detail below, the second state of the switch COM2 (terminals EB20 and EB21 connected together) makes it possible to turn the transistor T4 on, while the first state of the switch COM2 (terminals EB22 and EB21 connected together) makes it possible to connect the gate to the source of the transistor T4 and consequently to turn the transistor T4 off.

Referring now more particularly to FIG. 6, it may be seen that this second controllable switch COM2 comprises a transistor TMC20, called here "switching transistor", connected between the gate G4 and the source S4 of the transistor T4. More specifically, the drain of the transistor TMC20 is connected to the terminal EB21 and the source of the transistor TMC20 is connected to the terminal EB22. A diode is connected in antiparellel with the terminals of the transistor TMC20. Moreover, two Zener diodes DZ23 are also connected in series between the terminals EB21 and EB22 of the switch COM2. Two other Zener diodes DZ22 are also connected in series between the source and the gate of the switching transistor TMC20. The anode of the first of these two Zener diodes DZ22 is connected to the source of the transistor TMC20, while the cathode of the second of these two Zener diodes DZ22 is connected to the gate of the switching transistor TMC20.

The switch COM2 also comprises a resistive divider bridge R21 and R22 connected in series with a control transistor TC20 between the terminal EB20, i.e. the cathode of the diode DD2 and the second terminal (here, −Vcc) of the main supply. More specifically, the first resistor R21 of this resistive bridge is connected between the mid-point PM20 of the divider bridge and the drain of the control transistor TC20. The second resistor R22 of this divider bridge is connected between the mid-point PM20 and the terminal EB20.

When the source of the control transistor TC20 is connected to the second, −Vcc, terminal of the main supply, the gate of this control transistor constitutes the control input VC20 of the switch CM2. Moreover, a diode is also connected in anti-parallel with the terminals of this control transistor TC20. Finally, the gate G4 of the transistor T4 is connected to the cathode of the diode DD2 via current-limiting means formed here by a resistor R23 placed between the terminals EB21 and EB20. By way of indication, a CMOS inverter could replace this current-limiting resistor.

During the vertical scan of the spot, the controller gives the control signal scom20 the logic value "1" (for example by applying a voltage of 5 volts to the gate of the transistor TC20) and this transistor TC20 is therefore on. The gate of the switching transistor TCM20 therefore sees its potential "drawn" downwards, i.e. towards the −Vcc voltage, by the control transistor TC20. The transistor TCM20 then goes off, allowing the potential of the gate G4 of the transistor T4 to rise to the voltage of the cathode of the diode DD2 via the resistor R23.

Moreover, because of the existence of the gate-source capacitance of the transistor T4, which will gradually increase during successive conduction periods of the transistor T1, the voltage on the gate G4 of the transistor T4 will gradually rise until it reaches the voltage Vboot (within the threshold voltage of the diode DD2). The transistor T4 will therefore conduct.

It should be noted here that, although the operation of turning on the transistor T4 is actuated right at the start of the vertical scan of the spot, this transistor does not actually conduct immediately owing to the presence of the gate-source capacitance of this transistor. However, this is not a problem since, as explained above, it is strictly necessary for the transistor T4 to be on during the second phase of the vertical scan (returning current). Assuming that the scan period is 20 ms, the transistor T4 therefore has 10 ms to come on, which is plenty enough time.

The resistor R23 prevents the bootstrap capacitor from discharging too rapidly and consequently limits the current in the diode DD2. Moreover, in order to guarantee that the gate of the switching transistor TCM20 is drawn downward sufficiently to turn this transistor off, for example in order for it to reach a potential of 2Vbe (Vbe being the base-emitter threshold voltage of a bipolar transistor or the reverse threshold voltage of a diode) below the +Vcc supply voltage, it is particularly advantageous to choose the ratio R21/(R21+R22) to be less than or equal to 0.4 (in theory, the ratio R21/(R21+R22) is chosen to be less than (2Vcc−2Vbe)/(2Vcc+Vboot−Vbe)). A 100 kΩ resistor R21 and a 150 kΩ resistor R22 will thus be chosen, for example.

Moreover, the role of the two Zener diodes DZ22 is to prevent the gate voltage of the transistor TCM20 from dropping too low, which could result in excessively low reverse gate-source voltages with the risk of breaking the gate of the transistor.

During the flyback of the spot, the control signal scom20 is given the logic value "0" by applying, for example, the −Vcc voltage to the gate of the control transistor TC20. The gate of the switching transistor TCM20 therefore sees its potential "drawn" upwards by the second resistor R22. The switching transistor TCM20 therefore comes on, consequently turning the transistor T4 off.

The role of this resistor R22 is especially to prevent the mid-point PM20 from floating, thereby making it possible to maintain a high gate voltage in order to turn the switching transistor TCM20 on. This being so, in order not to give the gate of the transistor TCM20 too high a voltage during the flyback period of the spot, the two Zener diodes DZ22 also have the function of limiting the value of this gate voltage, for example to 10 volts (twice 5 volts if 5 volts is the direct Zener voltage). The role of the two Zener diodes DZ23, although they are not strictly necessary particularly on account of the voltage values adopted, is to prevent any risk of the gate voltage G4 of the transistor T4 from suddenly rising, especially in dynamic mode. Thus, when the transistor T4 is on, the two Zener diodes DZ23 also limit the gate voltage to 10 volts (twice 5 volts). Reference will now be made more particularly to FIGS. 7 and 8 in order to illustrate an advantageous control of the transistor T3 of the first two-way switch, using the energy stored in the auxiliary capacitor C (the flyback capacitor). The controller comprises a first controllable switch COM1 (the term "first" is again used here by analogy with the expression "first two-way switch"). This controllable switch COM1 is connected to the two terminals of the auxiliary capacitor C as well as to the gate G3 of the transistor T3 of the first two-way switch.

More specifically, the switch COM1 comprises a control input EC10 which receives a control signal scom10 transmitted by the controller. It also comprises a first terminal EB10 connected to the second terminal BC2 of the auxiliary capacitor C. Another terminal EB11 of the switch COM1 is connected to the gate G3 of the transistor T3 and a third terminal EB12 of the switch COM1 is connected to the source S3 of the transistor T3.

The control signal scom10 makes it possible to set the switch COM1 to a first state in which this first switch COM1 connects the gate G3 and the source S3 of the transistor T3 together (terminals EB11 and EB12 connected together), and a second state in which the switch connects the gate G3 of the transistor T3 to the second terminal BC2 of the auxiliary capacitor C (terminals EB11 and EB10 connected together). In the first state, the transistor T3 is off, while it is on in the second state of the switch COM1.

FIG. 8 illustrates in greater detail the internal architecture of the first switch COM1. This architecture is similar to that of the second switch COM2. More specifically, the switch COM1 comprises a switching transistor TCM10 connected between the gate G3 and the source S3 of the transistor T3, as well as a resistive divider bridge R11, R12 connected in series with a control transistor TC10 between the terminal EB10 (i.e. the second terminal BC2 of the auxiliary capacitor) and the second, −Vcc, terminal of the main supply. The gate G3 of the transistor T3 is connected to the second terminal BC2 of the auxiliary capacitor via a current-limiting means R13 formed here by a resistor R13 connected between the terminals EB11 and EB10. Here again, a CMOS inverter could replace this resistor R13. Finally, the gate of the switching transistor TCM10 is connected to the midpoint PM10 of the resistive divider bridge R11, R12.

The control input EC10 of the switch CM1 is formed by the gate of the control transistor TC10. During the vertical scan of the spot, the controller gives the control signal scom10 the logic value "0", turning the control transistor TC10 off. Consequently, the gate of the switching transistor TCM10 sees its potential "drawn" upwards by the resistor R12.

The switching transistor TCM10 therefore comes on, consequently connecting the gate and the source of the transistor T3 together and consequently turning this transistor T3 off. Here again, in a manner similar to that described above, in the case of the switch COM2, the two Zener diodes DZ12 allow the voltage on the gate of the transistor TCM10 to be limited to two Zener voltages, i.e. twice 5 volts, for example.

During the flyback of the spot, the control signal scom10 takes the logic value "1", turning the control transistor TC10 on. The voltage on the gate of the switching transistor TCM10 is therefore instantly drawn downwards for the purpose of turning the transistor TCM10 off and consequently turning the transistor T3 on. However, if the voltage on the gate of the transistor TCM10 drops too low, the transistor TCM10 is turned off and the gate G3 of the transistor T3 can then start to charge up while the transistor T4 of the second two-way switch is still off. In this case, the result may be that both transistors T3 and T4 conduct simultaneously, which would discharge the auxiliary capacitor C into the main supply and therefore causing an uncontrolled large current, something which would be a problem in certain applications. In order to remedy this drawback, the invention provides for the switching transistor TCM10 to be left slightly conducting with a lower gate voltage until the transistor T4 is off. In this regard, the ratio K=R11/(R11+R12) is chosen to be greater than Vz/2Vcc.

If the Zener voltage Vz is chosen to be 5 volts and the minimum supply voltage is chosen to be 9 volts, a K ratio is obtained which must be greater than 5/18. A K ratio greater than 0.25 is therefore preferably chosen. Moreover, when the transistor T4 is off, the source voltage of the transistor T3 then rises to +Vcc. Furthermore, in order to ensure that the switching transistor TCM10 is off so that the transistor T3 becomes conducting, it is preferred to choose a K ratio of less than 1/2, thereby making it possible to obtain a gate voltage of the transistor TCM10 of Vcc−2Vbe (in order to achieve this, in theory this K ratio should be less than (2Vcc−2Vbe)/4Vcc)

Moreover, since the transistor TCM10 is off, the gate voltage of the transistor T3 increases because of the resistor R13, thereby turning the transistor T3 on. Once again, the function of the Zener diodes DZ12 is especially to prevent the gate voltage of the transistor TCM10 from dropping too low. Moreover, the role of the Zener diodes DZ13 is to limit the gate voltage G3 of the transistor T3 to twice 5 volts. This is because, in the absence of these Zener diodes, the gate voltage could rise up to +2Vcc (26 volts if, for example, +Vcc=13 volts) owing to the energy stored in the auxiliary capacitor C and to the supply voltage.

Here again, those skilled in the art will have noted that the transistor T3 does not immediately conduct from the start of the flyback of the spot. However, this is not a problem because, on the one hand, of the presence of the diode D3 and because, on the other hand, the current flows into the vertical deflection circuit only in the second flyback phase FB2.

The embodiments illustrated on the one hand in FIGS. 5 and 6 and on the other hand in FIGS. 7 and 8 may be realized independently of each other. This being the case, it is particularly advantageous to combine the embodiment illustrated in FIGS. 7 and 8 with that illustrated in FIGS. 5 and 6. Those skilled in the art will have noted that these embodiments allow the transistors T3 and T4 to be controlled with conventional low-voltage logic signals, especially 5 volt signals. In all the variants that have just been described, the output stage ETS, the means MFB and the filter F may be easily produced within the same integrated structure.

Figure 9:
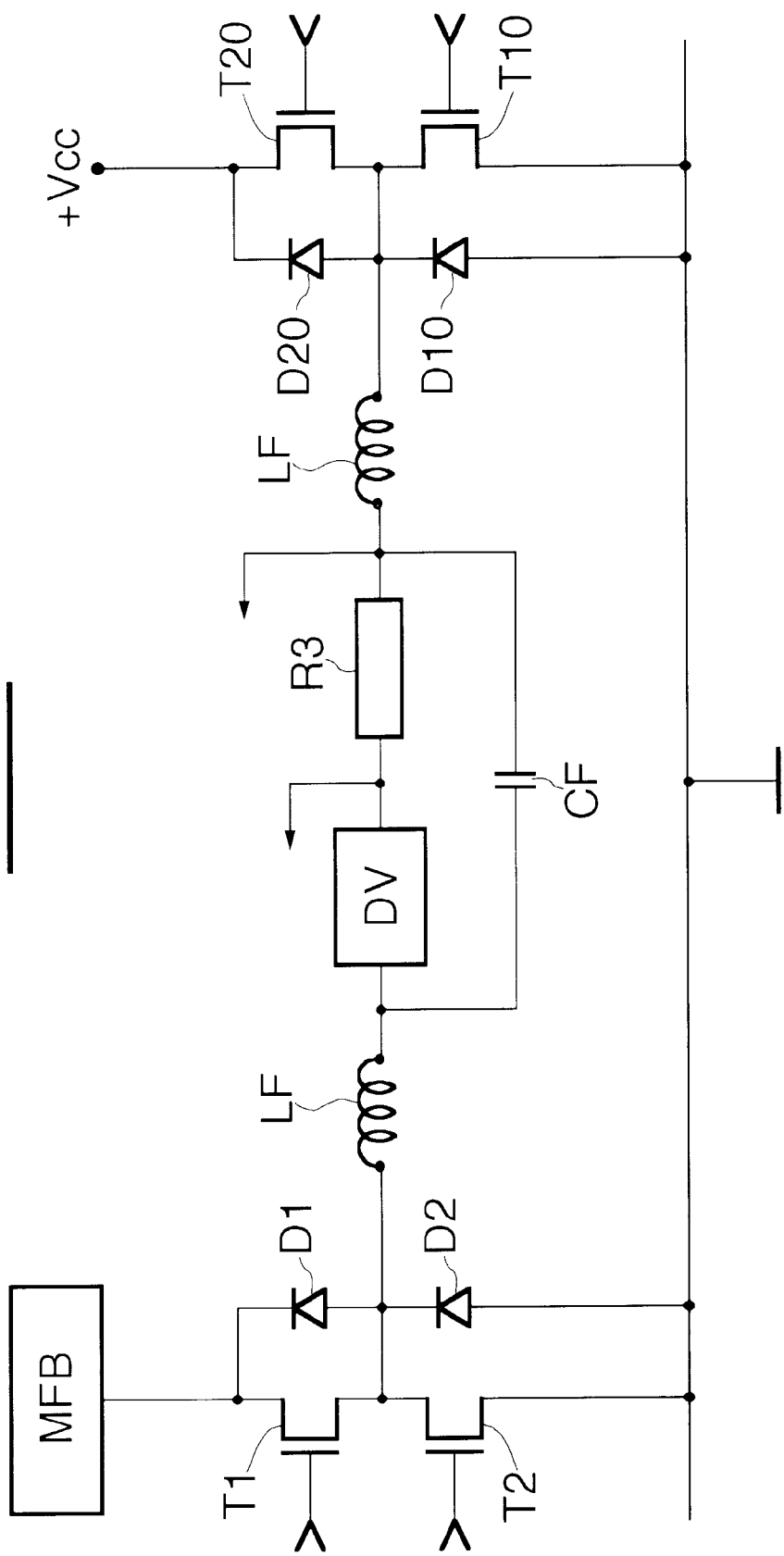
FIG. 9 illustrates, diagrammatically, another embodiment of a device according to the invention, comprising an output stage in the form of a complete bridge.

FIG. 9 illustrates diagrammatically an embodiment variant of the output stage in the form of a complete bridge. More specifically, according to this variant, two other transistors T10 and T20, associated with two diodes D10 and D20 connected in antiparallel, are added to the first two transistors T1 and T2. The transistors T1, T2, T10 and T20 are supplied between +Vcc and earth. The transistors T1 and T10 are controlled simultaneously and the transistors T2 and T20 are controlled simultaneously. Of course, the means MFB are connected to only one of the two pairs of transistors, in this case for example the transistors T1 and T2. The smoothing filter is then composed of two inductors LF, connected respectively to the common terminals of the two transistors of each pair. The deflector and the resistor R3 are connected in series between the two inductors LF and the capacitor CF of the filter F is connected in parallel to the terminals of the deflector DV and of the resistor R3. In this case, the feedback loop is made in a differential manner, as indicated very diagrammatically by the two arrows at the terminals of the resistor R3.

What is claimed is:
1. A device for controlling a vertical deflection circuit for the vertical scan and flyback of a spot scanning a screen, the device comprising:
an output amplifier stage for controlling the vertical scan of the spot, the output amplifier stage including at least first and second transistors connected together and capable of operating in an alternating switching mode to control the vertical scan of the spot;

an auxiliary voltage supply capable of delivering an overvoltage to the vertical deflection circuit;

a first controllable switch connected between the auxiliary voltage supply and the output amplifier stage for regulating the delivery of the overvoltage to the vertical deflection circuit for flyback of the spot; and a second controllable switch connected to the first transistor of the output amplifier stage and for connection to a main voltage supply, for preventing delivery of the overvoltage during control of the vertical scan of the spot;

wherein the first controllable switch comprises a third transistor and a third diode connected in anti-parallel with the terminals of the third transistor, an anode of the third diode being connected to the first transistor; and wherein the second controllable switch comprises a fourth transistor connected in series between the first transistor and the first terminal of the main voltage supply, and a fourth diode connected in anti-parallel with the terminals of the fourth transistor, a cathode of the fourth transistor being connected to the first transistor and an anode of the fourth transistor being connected to the first terminal of the main voltage supply, the fourth transistor being on while the third transistor is off, and vice versa.

2. The device according to claim 1, further comprising a smoothing filter connected to the output amplifier stage for outputting a signal to the vertical deflection circuit.

3. The device according to claim 1, wherein the output amplifier stage further comprises at least first and second diodes, the first diode being connected in anti-parallel with the first transistor, and the second diode being connected in anti-parallel with the second transistor.

4. The device according to claim 1, wherein the first controllable switch is connected in series between the auxiliary voltage supply and the first transistor of the output amplifier stage.

5. The device according to claim 1, further comprising a controller to control the first and second transistors of the output amplifier stage and the. first and second controllable switches, wherein, during control of the vertical scan of the spot, the controller controls the first and second transistors in an alternating manner, with reference to a reference input signal, opens the first controllable switch and closes the second controllable switch, and wherein, during control of the flyback of the spot, the controller turns the first transistor on, closes the first controllable switch and opens the second controllable switch.

6. The device according to claim 1, wherein the output amplifier stage further comprises third and fourth transistors connected to define a bridge, and wherein the smoothing filter is connected between a common terminal of the first and second transistors and a common terminal of the third and fourth transistors.

7. The device according to claim 1, wherein the device is an integrated circuit having a substrate and the first and second transistors each comprise isolated-gate field-effect transistors each with a source connected to the substrate to define a respective associated diode connected in anti-parallel therewith.

8. A device for controlling a vertical deflection circuit for the vertical deflection of a spot scanning a screen, comprising:

an output amplifier stage having a plurality of transistors, capable of operating in Class-D operation for at least controlling a vertical scan of the spot;

a smoothing filter connected to a common terminal of the plurality of transistors;

a main supply for supplying the output amplifier stage;

an auxiliary supply for delivering an overvoltage to the vertical deflection circuit for flyback of the spot;

a first controllable two-way switch connected to the output amplifier stage and to the auxiliary supply;

a second controllable two-way switch connected between a first transistor of the output amplifier stage and a first terminal of the main supply; and a controller for controlling the plurality of transistors of the output amplifier stage in Class-D operation, for controlling the first controllable two-way switch to allow a current to flow through the first controllable two-way switch and allow the overvoltage to be delivered, and for controlling the second controllable two-way switch to prevent a current from flowing through the first controllable two-way switch during the vertical scan of the spot and thus prevent the overvoltage from being delivered during the vertical scan of the spot.

9. The device according to claim 8, wherein the output amplifier stage further comprises a plurality of diodes each of which is connected in antiparallel with the terminals of one of the plurality of transistors.

10. The device according to claim 8, wherein the first two-way switch comprises a first two-way switch transistor and a first two-way switch diode connected in antiparallel with the terminals of the first two-way switch transistor, the anode of the first two-way switch diode being connected to the first transistor of the output amplifier stage; wherein the second two-way switch comprises a second two-way switch transistor connected in series between the first transistor of the output amplifier stage and the first terminal of the main supply, and a second two-way switch diode connected in antiparallel with the terminals of the second two-way switch transistor, the cathode of the second two-way switch diode being connected to the first transistor of the output amplifier stage and the anode of the second two-way switch diode being connected to the first terminal of the main supply.

11. The device according to claim 10, wherein the auxiliary supply comprises an auxiliary capacitor having a first terminal connected to the first terminal of the main supply via the first two-way switch and to a second terminal of the main supply via a controllable auxiliary switch, and having a second terminal connected to the output amplifier stage and to the second two-way switch.

12. The device according to claim 11, wherein the controller comprises a first controllable switch connected to the terminals of the auxiliary capacitor and to the gate of the first two-way switch transistor, a first state of the first controllable switch connects the gate and the source of the first two-way switch transistor together and a second state connects the gate of the first two-way switch transistor to the second terminal of the auxiliary capacitor.

13. The device according to claim 12, wherein the first controllable switch comprises a switching transistor connected between the gate and the source of the first two-way switch transistor, and a resistive divider bridge connected in series with a control transistor between the second terminal of the auxiliary capacitor and the second terminal of the main supply, wherein the gate of the first two-way switch transistor is connected to the second terminal of the auxiliary capacitor via a current-limiter and the gate of the switching transistor is connected to a node of the resistive divider bridge.

14. The device according to claim 13, wherein the resistive divider bridge comprises a first resistor connected between the node and the second terminal of the main supply, and a second resistor connected between the node and the second terminal of the auxiliary capacitor, and the ratio of the resistance value of the first resistor to the sum of the resistance values of the first and second resistors is between 0.25 and 0.5.

15. The device according to claim 10, wherein the first two-way switch is connected in series between the auxiliary supply and the first transistor of the output stage.

16. The device according to claim 10, wherein the output amplifier stage comprises a bootstrap capacitor connected to the first transistor of the output amplifier stage, the bootstrap capacitor comprising a first terminal connected to the gate of the first transistor of the output amplifier stage and a second terminal connected to the smoothing filter; wherein the controller comprises a second controllable switch connected to the first terminal of the bootstrap capacitor via a diode having an anode connected to the first terminal of the bootstrap capacitor; the second controllable switch being connected to the source and to the gate of the second two-way switch transistor; the second controllable switch having a first state connecting the gate and the source of the second two-way switch transistor together, and a second state connecting the gate of the second two-way switch transistor to the cathode of the diode.

17. The device according to claim 16, wherein the second controllable switch comprises a switching transistor connected between the gate and the source of the second two-way switch transistor, and a resistive divider bridge connected in series with a control transistor between the cathode of the diode and the second terminal of the main supply, the gate of the second two-way switch transistor is connected to the cathode of the diode via a current-limiter and the gate of the switching transistor is connected to a node of the resistive divider bridge.

18. The device according to claim 17, wherein the resistive divider bridge comprises a first resistor connected between the node and the second terminal of the main supply,, and a second resistor connected between the node and the cathode of the diode, and the ratio between the resistance value of the first resistor and the sum of the. resistance values of the first and second resistors is less than 0.4.

19. The device according to claim 8, wherein, during the control of the vertical scan of the spot, the controller controls the transistors of the output amplifier stage in Class-D operation on the basis of a reference signal, opens the first two-way switch and closes the second two-way switch; and wherein during the control of the flyback of the spot, the controller turns the first transistor of the output amplifier stage on, opens the second two-way switch and closes the first two-way switch.

20. The device according to claims 11, wherein during control of the vertical scan of the spot, the controller closes the auxiliary switch and, during control of the flyback of the spot, the controller opens the auxiliary switch.

21. The device according to claim 19, further comprising:
a preamplification stage which receives the reference in put signal feedback-modified by the current passing through the deflection circuit and delivers an error signal; and
a detector for detecting when the error signal crosses a predetermined threshold;
the controller triggering the flyback phase of the spot when the error signal crosses the threshold.

22. The device according to claim 8, wherein the plurality of transistors of the output amplifier stage comprises four transistors capable of operating in Class-D operation at least for controlling the vertical scan of the spot, the four transistors forming a complete bridge arrangement, and the smoothing filter being connected between a common terminal of the first two transistors and a common terminal of the other two transistors, the smoothing filter being distributed on either side of the deflection circuit.

23. The device according to claim 8, wherein the device is an integrated circuit having a substrate and the plurality of transistors are isolated-gate-field-effect transistors each with a source connected to the substrate to define an associated diode connected in antiparallel therewith.

24. A display comprising:
a main voltage supply;
a screen;
a vertical deflection circuit for vertical scan and flyback of a spot scanning the screen; and
a device for controlling the vertical deflection circuit, the device comprising
an output amplifier stage for controlling the vertical scan of the spot, and including at least first and second transistors connected together and capable of operating in an alternating switching mode to control the vertical scan of the spot;
an auxiliary voltage supply capable of delivering an overvoltage to the vertical deflection circuit;
a first controllable switch connected between the auxiliary voltage supply and the output amplifier stage for regulating the delivery of the overvoltage to the vertical deflection circuit for flyback of the spot; and
a second controllable switch connected to the first transistor of the output amplifier stage and for connection to the main voltage supply, for preventing delivery of the overvoltage during control of the vertical scan of the spot;
wherein the first controllable switch comprises a third transistor and a third diode connected in anti-parallel with the terminals of the third transistor, an anode of the third diode being connected to the first transistor; and
wherein the second controllable switch comprises a fourth transistor connected in series between the first transistor and a first terminal of the main voltage supply, and a fourth diode connected in anti-parallel with the terminals of the fourth transistor, a cathode of the fourth transistor being connected to the first transistor and an anode of the fourth transistor being connected to the first terminal of the main voltage supply, the fourth transistor being on while the third transistor is off, and vice versa.

25. The display according to claim 24, wherein the device further comprises a smoothing filters connected to the output amplifier stage for outputting a signal to the vertical deflection circuit.

26. The display according to claim 24, wherein the output amplifier stage further comprises at least first and second diodes, the first diode being connected in anti-parallel with the first transistor, and the second diode being connected in anti-parallel with the second transistor.

27. The display according to claim 24, wherein the first controllable switch is connected in series between the auxiliary voltage supply and the first transistor of the output amplifier stage.

28. The display according to claim 24, further comprising a controller to control the first and second transistors of the output amplifier stage and the first and second controllable switches, wherein, during control of the vertical scan of the spot, the controller controls the first and second transistors in an alternating manner, with reference to a reference input signal, opens the first controllable switch and closes the second controllable switch, and wherein, during control of the flyback of the spot, the controller turns the first transistor on, closes the first controllable switch and opens the second controllable switch.

29. The display according to claim 24, wherein the output amplifier stage further comprises third and fourth transistors connected to define a bridge, and wherein the smoothing filter is connected between a common terminal of the first and second transistors and a common terminal of the third and fourth transistors.

30. The display according to claim 24, wherein the device is an integrated circuit having a substrate and the first and second transistors each comprise isolated-gate field-effect transistors each with a source connected to the substrate to define a respective associated diode connected in antiparallel therewith.

31. A display comprising:
a main voltage supply;
a screen;
a vertical deflection circuit for vertical scan and flyback of a spot scanning the screen; and
a device for controlling the vertical deflection circuit, the device comprising
an output amplifier stage having a plurality of transistors, capable of operating in Class-D operation for at least controlling a vertical scan of the spot, and a smoothing filter connected to a common terminal of the plurality of transistors;
a main supply for supplying the output amplifier stage;
an auxiliary supply for delivering an overvoltage to the vertical deflection circuit for flyback of the spot;
a first controllable two-way switch connected to the output amplifier stage and to the auxiliary supply;
a second controllable two-way switch connected between a first transistor of the output amplifier stage and a first terminal of the main supply; and
a controller for controlling the plurality of transistors of the output amplifier stage in Class-D operation, for controlling the first controllable two-way switch so as to allow a current to flow through the first controllable two-way switch and allow the overvoltage to be delivered, and for controlling the second controllable two-way switch so as to prevent a current from flowing through the first controllable two-way switch during the vertical scan of the spot and thus prevent the overvoltage from being delivered during the vertical scan of the spot.

32. The display according to claim 31, wherein the output amplifier stage further comprises a plurality of diodes each of which is connected in antiparallel with the terminals of one of the plurality of transistors.

33. The display according to claim 31, wherein the first two-way switch comprises a first two-way switch transistor and a first two-way switch diode connected in antiparallel with the terminals of the first two-way switch transistor, the anode of the first two-way switch diode being connected to the first transistor of the output amplifier stage; wherein the second two-way switch comprises a second two-way switch transistor connected in series between the first transistor of the output amplifier stage and the first terminal of the main supply, and a second two-way switch diode connected in antiparallel with the terminals of the second two-way switch transistor, the cathode of the second two-way switch diode being connected to the first transistor of the output amplifier stage and the anode of the second two-way switch diode being connected to the first terminal of the main supply.

34. The display according to claim 33, wherein the auxiliary supply comprises an auxiliary, capacitor having a first terminal connected to the first terminal of the main supply via the first two-way switch and to a second terminal of the main supply via a controllable auxiliary switch, and having a second terminal connected to the output amplifier stage and to the second two-way switch.

35. The display according to claim 34, wherein the controller comprises a first controllable switch connected to the terminals of the auxiliary capacitor and to the gate of the first two-way switch transistor, a first state of the first controllable switch connects the gate and the source of the first two-way switch transistor together and a second state connects the gate of the first two-way switch transistor to the second terminal of the auxiliary capacitor.

36. The display according to claim 35, wherein the first controllable switch comprises a switching transistor connected between the gate and the source of the first two-way switch transistor, and a resistive divider bridge connected in series with a control transistor between the second terminal of the auxiliary capacitor and the second terminal of the main supply, wherein the gate of the first two-way switch transistor is connected to the second terminal of the auxiliary capacitor via a current-limiter and the gate of the switching transistor is connected to a node of the resistive divider bridge.

37. The display according to claim 36, wherein the resistive divider bridge comprises a first resistor connected between the node and the second terminal of the main supply, and a second resistor connected between the node and the second terminal of the auxiliary capacitor, and the ratio of the resistance value of the first resistor to the sum of the resistance values of the first and second resistors is between 0.25 and 0.5.

38. The display according to claim 33, wherein the first two-way switch is connected in series between the auxiliary supply and the first transistor of the output stage.

39. The display according to claim 33, wherein the output amplifier stage comprises a bootstrap capacitor connected to the first transistor of the output amplifier stage, the bootstrap capacitor comprising a first terminal connected to the gate of the first transistor of the output amplifier stage and a second terminal connected to the smoothing filter; wherein the controller comprises a second controllable switch connected to the first terminal of the bootstrap capacitor via a diode having an anode connected to the first terminal of the bootstrap capacitor; the second controllable switch being connected to the source and to the gate of the second two-way switch transistor; the second controllable switch having a first state connecting the gate and the source of the second two-way switch transistor together, and a second state connecting the gate of the second two-way switch transistor to the cathode of the diode.

40. The display according to claim 39, wherein the second controllable switch comprises a switching transistor connected between the gate and the source of the second two-way switch transistor, and a resistive divider bridge connected in series with a control transistor between the cathode of the diode and the second terminal of the main supply, the gate of the second two-way switch transistor is connected to the cathode of the diode via a current-limiter and the gate of the switching transistor is connected to a node of the resistive divider bridge.

41. The display according to claim 40, wherein the resistive divider bridge comprises a first resistor connected between the node and the second terminal of the main supply, and a second resistor connected between the node and the cathode of the diode, and the ratio between the resistance value of the first resistor and the sum of the resistance values of the first and second resistors is less than 0.4.

42. The display according to claim 31, wherein, during the control of the vertical scan of the spot, the controller controls the transistors of the output amplifier stage in Class-D operation on the basis of a reference signal, opens the first two-way-switch and closes the second two-way switch; and wherein during the control of the flyback of the spot, the controller turns the first transistor of the output amplifier stage on, opens the second two-way switch and closes the first two-way switch.

43. The display according to claims 34, wherein, during control of the vertical scan of the spot the controller closes the auxiliary switch and, during control of the flyback of the spot, the controller opens the auxiliary switch.

44. The display according to claim 42, wherein the device further comprises:
a preamplification stage which receives the reference input signal feedback-modified by the current passing through the deflection circuit and delivers an error signal; and
a detector for detecting when the error signal crosses a predetermined threshold;
the controller triggering the flyback phase of the spot when the error signal crosses the threshold.

45. The display according to claim 31, wherein the plurality of transistors of the output amplifier stage comprises four transistors capable of operating in Class-D operation at least for controlling the vertical scan of the spot, the four transistors forming a complete bridge arrangement, and the smoothing filter being connected between a common terminal of the first two transistors and a common terminal of the other two transistors, the smoothing filter being distributed on either side of the deflection circuit.

46. The display according to claim 31, wherein the device is an integrated circuit having a substrate and the plurality of transistors are isolated-gate-field-effect transistors each with a source connected to the substrate to define an associated diode connected in antiparallel therewith.

47. A method for controlling a vertical deflection circuit for the vertical scan and flyback of a spot scanning a screen, the method comprising the steps of:
providing an output amplifier stage to control the vertical scan of the spot, the output amplifier stage including at least first and second transistors connected together and capable of operating in an alternating switching mode to control the vertical scan of the spot;
delivering an overvoltage to the vertical deflection circuit;
regulating the delivery of the overvoltage to the vertical deflection circuit for flyback of the spot with a first controllable switch connected to the output amplifier stage, the first controllable switch comprising a third transistor and a third diode connected in anti-parallel with the terminals of the third transistor, an anode of the third diode being connected to the first transistor;
preventing delivery of the overvoltage during control of the vertical scan of the spot with a second controllable switch connected to the first transistor of the output amplifier stage and for connection to a main voltage supply, the second controllable switch comprising a fourth transistor connected in series between the first transistor and the first terminal of the main voltage supply, and a fourth diode connected in anti-parallel with the terminals of the fourth transistor, a cathode of the fourth transistor being connected to the first transistor and an anode of the fourth transistor being connected to the first terminal of the main voltage supply;
turning the fourth transistor on while turning the third transistor off; and
turning the fourth transistor off while turning the third transistor on.

48. The method according to claim 47, further comprising the step of filtering an output of the output amplifier stage to the vertical deflection circuit.

49. The method according to claim 47, wherein the output amplifier stage further comprises at least first and second diodes, the first diode being connected in anti-parallel with the first transistor, and the second diode being connected in anti-parallel with the second transistor.

50. The method according to claim 47, wherein the overvoltage is delivered by an auxiliary voltage supply, and the first controllable switch is connected Win series between the auxiliary voltage supply and the first transistor of the output amplifier stage.

51. The method according to claim 47, further comprising the step of controlling the first and second transistors of the output amplifier stage and the first and second controllable switches, wherein, during control of the vertical scan of the spot, the first and second transistors are controlled to operate in an alternating manner, with reference to a reference input signal, the first controllable switch is controlled to open, and the second controllable switch is controlled to close, and wherein, during control of the flyback of the spot, the first transistor is turned on, the first controllable switch is closed and the second controllable switch is opened.

52. The method according to claim 47, wherein the output amplifier stage further comprises third and fourth transistors connected to define a bridge.

53. A method for controlling a vertical deflection circuit for the vertical deflection of a spot scanning a screen, comprising the steps of:
providing an output amplifier stage having at least two transistors which operate in Class-D operation at least for controlling a vertical scan of the spot;
supplying the output amplifier stage by a main supply; and
providing an auxiliary supply for delivering an overvoltage to the vertical deflection circuit to initiate the flyback of the spot, the overvoltage being delivered by controlling a first two-way switch connected to the output amplifier stage and to the auxiliary supply to allow a current to flow through the first two-way switch and controlling a second two-way switch, connected between a first transistor of the output stage and a first terminal of the main supply, to prevent a current from flowing through the first switch during the vertical scan of the spot and thus prevent the overvoltage from being delivered during the vertical scan of the spot.

54. The method according to claim 53, wherein the first two-way switch comprises a first two-way switch transistor and a first two-way switch diode connected in antiparallel with the terminals of the first two-way switch transistor, the anode of the first two-way switch diode being connected to the first transistor of the output amplifier stage; and wherein the second two-way switch comprises a second two-way switch transistor connected in series between the first transistor of the output amplifier stage and the first terminal of the main supply, and a second two-way switch diode connected in antiparallel with the terminals of the second two-way switch transistor, the cathode of the second two-way switch diode being connected to the first transistor of the output amplifier stage and the anode being connected to the first terminal of the main supply; and wherein the vertical scan of the spot comprises a first phase during which the current flows into the vertical deflection circuit and a second phase during which the current flows from the vertical deflection circuit; wherein the flyback of the spot comprises a first phase during which the current flows from the vertical deflection circuit and a second phase during which the current flows into the vertical deflection circuit; wherein the first two-way switch transistor is turned off during the vertical scan, while the second two-way switch transistor is turned on, at least when the second transistor of the output amplifier stage is off during the second phase of the vertical scan of the spot; and wherein the second two-way switch transistor is off during the flyback of the spot whereas the first two-way switch transistor is turned on, at least during the second phase of the flyback of the spot.

55. The method according to claim 54, wherein the second two-way switch transistor is turned on at the start of the vertical scan of the spot; and wherein, during the flyback of the spot, the first two-way switch transistor is turned on as soon as the second two-way switch transistor is turned off.

56. The method according to claim 54, wherein the first two-way switch is connected in series between the auxiliary supply and the first transistor of the output amplifier stage.

57. The method according to claim 54, wherein the auxiliary supply comprises an auxiliary capacitor having a first terminal connected to the first terminal of the main supply via the first two-way switch and to a second terminal of the main supply via a controllable auxiliary switch, and having a second terminal connected to the output amplifier stage and to the second two-way switch; wherein the auxiliary switch is open when the first two-way switch transistor is on, and the auxiliary switch is closed when the first two-way switch transistor is off.

58. The method according to claim 57, wherein the auxiliary switch is closed during the vertical scan of the spot and the auxiliary switch is open during the flyback of the spot.

59. The method according to claim 57, wherein the first two-way switch transistor is connected between the first terminal of the auxiliary capacitor and the first terminal of the main supply and the energy stored in the auxiliary capacitor is used to turn on the first two-way switch transistor.

60. The method according to claim 59, wherein the gate of the first two-way switch transistor is connected to the first terminal of the auxiliary capacitor in order to turn the first two-way switch transistor on and the gate of the first two-way switch transistor is connected to its source in order to turn the first two-way switch transistor off.

61. The method according to claim 55, wherein a bootstrap capacitor is connected between the source and the gate of the first transistor of the output amplifier stage and in that the energy stored in the bootstrap capacitor is used to turn on the second two-way switch transistor during the vertical scan of the spot.

62. The method according to claim 61, wherein the bootstrap capacitor is connected to the gate of the second two-way switch transistor during the vertical scan of the spot and the gate of the second two-way switch transistor is connected to its source during the flyback of the spot.

63. The method according to claim 53, wherein the transistors of the output amplifier stage are controlled in Class-D operation on the basis of a reference signal during the vertical scan of the spot and the first transistor of the output amplifier stage is turned on during the flyback of the spot.

64. The method according to claim 53, wherein the transistors of the output amplifier stage are controlled in Class-D operation on the basis of a reference signal during the vertical scan of the spot, the reference signal being feedback-modified by the current flowing through the vertical deflection circuit and being amplified, so as to deliver an error signal; and when the error signal crosses a predetermined threshold the flyback of the spot is triggered.

65. A device for controlling a vertical deflection circuit for the vertical scan and flyback of a spot scanning a screen, the device comprising:
   an output amplifier stage for controlling the vertical scan of the spot, the output amplifier stage including at least first and second transistors connected together and capable of operating in an alternating switching mode to control the vertical scan of the spot;
   an auxiliary voltage supply capable of delivering an overvoltage to the vertical deflection circuit;
   a first controllable switch connected between the auxiliary voltage supply and the output amplifier stage for regulating the delivery of the overvoltage to the vertical deflection circuit for flyback of the spot;
   a second controllable switch connected to the output amplifier stage and for connection to a main voltage supply, for preventing delivery of the overvoltage during control of the vertical scan of the spot; and
   a controllable auxiliary switch;
   wherein the auxiliary voltage supply comprises a capacitor having a first terminal connected to a first terminal of the main voltage supply via the first controllable switch and to a second terminal of the main voltage supply via the controllable auxiliary switch, and having a second terminal connected to the output amplifier stage and to the second controllable switch, the controllable auxiliary switch being open when the first controllable switch is closed, and vice versa.

66. The device according to claim 65, further comprising a controller to control the first and second transistors of the output amplifier stage and the first and second controllable switches, wherein, during control of the vertical scan of the spot, the controller controls the first and second transistors in an alternating manner, with reference to a reference input signal, opens the first controllable switch and closes the second controllable switch, and wherein, during control of the flyback of the spot, the controller turns the first transistor on, closes the first controllable switch and opens the second controllable switch.

67. The device according to claims 66, wherein, during control of the vertical scan of the spot, the controller closes the controllable auxiliary switch, and wherein, during control of the flyback of the spot, the controller opens the controllable auxiliary switch.

68. The device according to claim 67, further comprising:
   a preamplification stage which receives the reference input signal feedback-modified by a current passing through the vertical deflection circuit and outputs an error signal to the controller; and a detector which detects when the error signal crosses a predetermined threshold so that the controller can induce the flyback of the spot.

69. A device for controlling a vertical deflection circuit for the vertical scan and flyback of a spot scanning a screen, the device comprising:
an output amplifier stage for controlling the vertical scan of the spot, the output amplifier stage including at least first and second transistors connected together and capable of operating in an alternating switching mode to control the vertical scan of the spot;
an auxiliary voltage supply capable of delivering an overvoltage to the vertical deflection circuit;
a first controllable switch connected between the auxiliary voltage supply and the output amplifier stage for regulating the delivery of the overvoltage to the vertical deflection circuit for flyback of the spot;
a second controllable switch connected to the output amplifier stage and for connection to a main voltage supply, for preventing delivery of the overvoltage during control of the vertical scan of the spot;
wherein the output amplifier stage further comprises third and fourth transistors connected to define a bridge, and wherein the smoothing filter is connected between a common terminal of the first and second transistors and a common terminal of the third and fourth transistors.

70. A device for controlling a vertical deflection circuit for the vertical scan and flyback of a spot scanning a screen, the device comprising:
an output amplifier stage for controlling the vertical scan of the spot, the output amplifier stage including at least first and second transistors connected together and capable of operating in an alternating switching mode to control the vertical scan of the spot;
an auxiliary voltage supply capable of delivering an overvoltage to the vertical deflection circuit;
a first controllable switch connected between the auxiliary voltage supply and the output amplifier stage for regulating the delivery of the overvoltage to the vertical deflection circuit for flyback of the spot;
a second controllable switch connected to the output amplifier stage and for connection to a main voltage supply, for preventing delivery of the overvoltage during control of the vertical scan of the spot;
wherein the device is an integrated circuit having a substrate and the first and second transistors each comprise isolated-gate field-effect transistors each with a source connected to the substrate to define a respective associated diode connected in anti-parallel therewith.

71. A display comprising:
a main voltage supply;
a screen;
a vertical deflection circuit for vertical scan and flyback of a spot scanning the screen; and
a device for controlling the vertical deflection circuit, the device comprising
an output amplifier stage for controlling the vertical scan of the spot, and including at least first and second transistors connected together and capable of operating in an alternating switching mode to control the vertical scan of the spot;
an auxiliary voltage supply capable of delivering an overvoltage to the vertical deflection circuit;
a first controllable switch connected between the auxiliary voltage supply and the output amplifier stage for regulating the delivery,of the overvoltage to the vertical deflection circuit for flyback of the spot;
a second controllable switch connected to the output amplifier stage and for connection to the main voltage supply, for preventing delivery of the overvoltage during control of the vertical scan of the spot; and
a controllable auxiliary switch;
wherein the auxiliary voltage supply comprises a capacitor having a first terminal connected to a first terminal of the main voltage supply via the first controllable switch and to a second terminal of the main voltage supply via the controllable auxiliary switch, and having a second terminal connected to the output amplifier stage and to the second controllable switch, the controllable auxiliary switch being open when the first controllable switch is closed, and vice versa.

72. The display according to claim 71, further comprising a controller to control the first and second transistors of the output amplifier stage and the first and second controllable switches, wherein, during control of the vertical scan of the spot, the controller controls the first and second transistors in an alternating manner, with reference to a reference input signal, opens the first controllable switch and closes the second controllable switch, and wherein, during control of the flyback of the spot, the controller turns the first transistor on, closes the first controllable switch and opens the second controllable switch.

73. The display according to claim 72, wherein, during control of the vertical scan of the spot, the controller closes the controllable auxiliary switch, and wherein, during control of the flyback of the spot, the controller opens the controllable auxiliary switch.

74. The display according to claim 73, further comprising:
a preamplification stage which receives the reference input signal feedback-modified by a current passing through the vertical deflection circuit and outputs an error signal to the controller; and
a detector which detects when the error signal crosses a predetermined threshold so that the controller can induce the flyback of the spot.

75. A method for controlling a vertical deflection circuit for the vertical scan and flyback of a spot scanning a screen, the method comprising the steps of:
providing an output amplifier stage to control the vertical scan of the spot, the output amplifier stage including at least first and second transistors connected together and capable of operating in an alternating switching mode to control the vertical scan of the spot;
delivering an overvoltage to the vertical deflection circuit;
regulating the delivery of the overvoltage to the vertical deflection circuit for flyback of the spot with a first controllable switch connected to the output amplifier stage;
preventing delivery of the overvoltage during control of the vertical scan of the spot with a second controllable switch connected to the output amplifier stage and for connection to a main voltage supply;

the overvoltage being delivered by an auxiliary voltage supply, and the first controllable switch being connected in series between the auxiliary voltage supply and the first transistor of the output amplifier stage; and the auxiliary voltage supply comprising a capacitor having a first terminal connected to a first terminal of the main voltage supply via the first controllable switch and to a second terminal of the main voltage supply via a controllable auxiliary switch, and having a second terminal connected to the output amplifier stage and to the second controllable switch, the controllable auxiliary switch being open when the first controllable switch is closed, and vice versa.

76. The method according to claim 75, wherein, during control of the vertical scan of the spot, the controllable auxiliary switch is closed, and wherein, during control of the flyback of the spot, the controllable auxiliary switch is opened.

* * * * *

UNITED STATES PATENT AND TRADEMARK OFFICE
CERTIFICATE OF CORRECTION

PATENT NO. : 6,411,048 B1
DATED : June 25, 2002
INVENTOR(S) : Philippe Maige and Yannick Guedon It is certified that error appears in the above-identified patent and that said Letters Patent is hereby corrected as shown below:

Column 9,
Line 21, delete "signal c" insert -- signal $\varepsilon$ --

Column 10,
Line 37, delete "vreg" insert -- Vreg --
Line 57, delete "For . this" insert -- For this --

Column 11,
Line 24, delete "antiparellel" insert -- antiparallel --

Column 15,
Line 44, delete "the . first" insert -- the first --

Column 17,
Line 43, delete "supply,," insert -- supply, --
Line 45, delete "the." insert -- the --
Line 57, delete "claims" insert -- claim --

Column 18,
Line 56, delete "filters" insert -- filter --

Column 20,
Line 8, delete "auxiliary, capacitor" insert -- auxiliary capacitor --

Column 21,
Line 20, delete "claims" insert -- claim --

Column 22,
Line 25, delete "Win" insert -- win --

Column 23,
Line 19, delete "the the" insert -- the --

UNITED STATES PATENT AND TRADEMARK OFFICE
CERTIFICATE OF CORRECTION

PATENT NO.   : 6,411,048 B1
DATED        : June 25, 2002
INVENTOR(S)  : Philippe Maige and Yannick Guedon It is certified that error appears in the above-identified patent and that said Letters Patent is hereby corrected as shown below:

<u>Column 24,</u>
Line 58, delete "claims" insert -- claim --

<u>Column 26,</u>
Line 7, delete "delivery,of" insert -- delivery of --

Signed and Sealed this

Eleventh Day of February, 2003

JAMES E. ROGAN
*Director of the United States Patent and Trademark Office*